United States Patent
Wober

(10) Patent No.: US 9,543,458 B2
(45) Date of Patent: *Jan. 10, 2017

(54) FULL COLOR SINGLE PIXEL INCLUDING DOUBLET OR QUADRUPLET SI NANOWIRES FOR IMAGE SENSORS

(71) Applicant: ZENA TECHNOLOGIES, INC., Cambridge, MA (US)

(72) Inventor: Munib Wober, Topsfield, MA (US)

(73) Assignee: ZENA TECHNOLOGIES, INC., Cambridge, MA (US)

( * ) Notice: Subject to any disclaimer, the term of this patent is extended or adjusted under 35 U.S.C. 154(b) by 113 days.

This patent is subject to a terminal disclaimer.

(21) Appl. No.: 14/291,888

(22) Filed: May 30, 2014

(65) Prior Publication Data

US 2014/0263967 A1  Sep. 18, 2014

Related U.S. Application Data

(63) Continuation of application No. 12/967,880, filed on Dec. 14, 2010, now Pat. No. 8,748,799.

(51) Int. Cl.
| | |
|---|---|
| *H01L 31/00* | (2006.01) |
| *H01L 31/0352* | (2006.01) |
| *B82Y 30/00* | (2011.01) |
| *H01L 27/146* | (2006.01) |
| *B82Y 20/00* | (2011.01) |
| *G02B 6/42* | (2006.01) |
| *G02B 6/10* | (2006.01) |
| *B82Y 15/00* | (2011.01) |

(52) U.S. Cl.
CPC ....... *H01L 31/035227* (2013.01); *B82Y 20/00* (2013.01); *B82Y 30/00* (2013.01); *H01L 27/14601* (2013.01); *H01L 27/14607* (2013.01); *B82Y 15/00* (2013.01); *G02B 6/107* (2013.01); *G02B 6/4298* (2013.01); *Y10S 977/954* (2013.01)

(58) Field of Classification Search
CPC ....................................................... B82Y 30/00
USPC ....................................... 250/214.1; 977/762
See application file for complete search history.

(56) References Cited

U.S. PATENT DOCUMENTS

| | | | |
|---|---|---|---|
| 1,918,848 | A | 7/1933 | Land |
| 3,903,427 | A | 9/1975 | Pack |

(Continued)

FOREIGN PATENT DOCUMENTS

| | | |
|---|---|---|
| CN | 1624925 | 6/2005 |
| CN | 1306619 | 3/2007 |

(Continued)

OTHER PUBLICATIONS

CMOS image sensor pixel microlens array optimization using FDTD Solutions, http://www.lumerical_com/fdtd_microlens/cmos_image_sensor_pixel_microlens.php, pp. 1-2, Jun. 25, 2008.

(Continued)

*Primary Examiner* — Thanh Luu

(74) *Attorney, Agent, or Firm* — Pillsbury Winthrop Shaw Pittman LLP

(57) ABSTRACT

An image sensor comprising a substrate and one or more of pixels thereon. The pixels have subpixels therein comprising nanowires sensitive to light of different color. The nanowires are functional to covert light of the colors they are sensitive to into electrical signals.

19 Claims, 9 Drawing Sheets

(56) References Cited

U.S. PATENT DOCUMENTS

| | | |
|---|---|---|
| 4,017,332 A | 4/1977 | James |
| 4,292,512 A | 9/1981 | Miller |
| 4,316,048 A | 2/1982 | Woodall |
| 4,357,415 A | 11/1982 | Hartman |
| 4,387,265 A | 6/1983 | Dalal |
| 4,394,571 A | 7/1983 | Jurisson |
| 4,400,221 A | 8/1983 | Rahilly |
| 4,443,890 A | 4/1984 | Eumurian |
| 4,513,168 A | 4/1985 | Borden |
| 4,531,055 A | 7/1985 | Shepherd, Jr. |
| 4,620,237 A | 10/1986 | Traino |
| 4,678,772 A | 7/1987 | Segal |
| 4,827,335 A | 5/1989 | Saito |
| 4,846,556 A | 7/1989 | Haneda |
| 4,857,973 A | 8/1989 | Yang |
| 4,876,586 A | 10/1989 | Dyck |
| 4,880,613 A | 11/1989 | Satoh |
| 4,896,941 A | 1/1990 | Hayashi |
| 4,950,625 A | 8/1990 | Nakashima |
| 4,971,928 A | 11/1990 | Fuller |
| 4,972,244 A | 11/1990 | Buffet |
| 4,990,988 A | 2/1991 | Lin |
| 5,071,490 A | 12/1991 | Yokota |
| 5,081,049 A | 1/1992 | Green |
| 5,096,520 A | 3/1992 | Faris |
| 5,124,543 A | 6/1992 | Kawashima |
| 5,217,911 A | 6/1993 | Denda |
| 5,247,349 A | 9/1993 | Olego |
| 5,272,518 A | 12/1993 | Vincent |
| 5,311,047 A | 5/1994 | Chang |
| 5,347,147 A | 9/1994 | Jones |
| 5,362,972 A | 11/1994 | Yazawa |
| 5,374,841 A | 12/1994 | Goodwin |
| 5,391,896 A | 2/1995 | Wanlass |
| 5,401,968 A | 3/1995 | Cox |
| 5,449,626 A | 9/1995 | Hezel |
| 5,468,652 A | 11/1995 | Gee |
| 5,602,661 A | 2/1997 | Schadt |
| 5,612,780 A | 3/1997 | Rickenbach |
| 5,671,914 A | 9/1997 | Kalkhoran |
| 5,696,863 A | 12/1997 | Kleinerman |
| 5,723,945 A | 3/1998 | Schermerhorn |
| 5,747,796 A | 5/1998 | Heard |
| 5,767,507 A | 6/1998 | Uenlue |
| 5,798,535 A | 8/1998 | Huang |
| 5,844,290 A | 12/1998 | Furumiya |
| 5,853,446 A | 12/1998 | Carre |
| 5,857,053 A | 1/1999 | Kane |
| 5,877,492 A | 3/1999 | Fujieda |
| 5,880,495 A | 3/1999 | Chen |
| 5,885,881 A | 3/1999 | Ojha |
| 5,900,623 A | 5/1999 | Tsang |
| 5,943,463 A | 8/1999 | Unuma |
| 5,968,528 A | 10/1999 | Deckner |
| 6,013,871 A | 1/2000 | Curtin |
| 6,033,582 A | 3/2000 | Lee |
| 6,037,243 A | 3/2000 | Ha |
| 6,046,466 A | 4/2000 | Ishida |
| 6,074,892 A | 6/2000 | Bowers |
| 6,100,551 A | 8/2000 | Lee |
| 6,270,548 B1 | 8/2001 | Campbell |
| 6,301,420 B1 | 10/2001 | Greenaway |
| 6,326,649 B1 | 12/2001 | Chang |
| 6,388,243 B1 | 5/2002 | Berezin |
| 6,388,648 B1 | 5/2002 | Clifton |
| 6,407,439 B1 | 6/2002 | Hier |
| 6,459,034 B2 | 10/2002 | Muramoto |
| 6,463,204 B1 | 10/2002 | Ati |
| 6,542,231 B1 | 4/2003 | Garrett |
| 6,563,995 B2 | 5/2003 | Keaton |
| 6,566,723 B1 | 5/2003 | Vook |
| 6,680,216 B2 | 1/2004 | Kwasnick |
| 6,709,929 B2 | 3/2004 | Zhang |
| 6,720,594 B2 | 4/2004 | Rahn |
| 6,771,314 B1 | 8/2004 | Bawolek |
| 6,805,139 B1 | 10/2004 | Savas |
| 6,812,473 B1 | 11/2004 | Amemiya |
| 6,904,187 B2 | 6/2005 | Fischer et al. |
| 6,927,145 B1 | 8/2005 | Yang |
| 6,960,526 B1 | 11/2005 | Shah |
| 6,967,120 B2 | 11/2005 | Jang |
| 6,969,899 B2 | 11/2005 | Yaung |
| 6,987,258 B2 | 1/2006 | Mates |
| 6,996,147 B2 | 2/2006 | Majumdar |
| 7,052,927 B1 | 5/2006 | Fletcher |
| 7,064,372 B2 | 6/2006 | Duan |
| 7,105,428 B2 | 9/2006 | Pan |
| 7,106,938 B2 | 9/2006 | Baek et al. |
| 7,109,517 B2 | 9/2006 | Zaidi |
| 7,153,720 B2 | 12/2006 | Augusto |
| 7,163,659 B2 | 1/2007 | Stasiak |
| 7,192,533 B2 | 3/2007 | Bakkers |
| 7,208,783 B2 | 4/2007 | Palsule |
| 7,230,286 B2 | 6/2007 | Cohen |
| 7,235,475 B2 | 6/2007 | Kamins |
| 7,241,434 B2 | 7/2007 | Anthony |
| 7,253,017 B1 | 8/2007 | Roscheisen |
| 7,254,151 B2 | 8/2007 | Lieber |
| 7,262,400 B2 | 8/2007 | Yaung |
| 7,265,328 B2 | 9/2007 | Mouli |
| 7,272,287 B2 | 9/2007 | Bise |
| 7,285,812 B2 | 10/2007 | Tang |
| 7,306,963 B2 | 12/2007 | Linden |
| 7,307,327 B2 | 12/2007 | Bahl |
| 7,311,889 B2 | 12/2007 | Awano |
| 7,326,915 B2 | 2/2008 | Kaluzhny |
| 7,330,404 B2 | 2/2008 | Peng |
| 7,335,962 B2 | 2/2008 | Mouli |
| 7,336,860 B2 | 2/2008 | Cyr |
| 7,339,110 B1 | 3/2008 | Mulligan et al. |
| 7,358,583 B2 | 4/2008 | Reznik |
| 7,381,966 B2 | 6/2008 | Starikov |
| 7,388,147 B2 | 6/2008 | Mulligan |
| 7,416,911 B2 | 8/2008 | Heath |
| 7,446,025 B2 | 11/2008 | Cohen |
| 7,462,774 B2 | 12/2008 | Roscheisen |
| 7,471,428 B2 | 12/2008 | Ohara |
| 7,491,269 B2 | 2/2009 | Legagneux |
| 7,507,293 B2 | 3/2009 | Li |
| 7,521,322 B2 | 4/2009 | Tang |
| 7,524,694 B2 | 4/2009 | Adkisson |
| 7,582,587 B2 | 9/2009 | Dufresne et al. |
| 7,582,857 B2 | 9/2009 | Gruev |
| 7,598,482 B1 | 10/2009 | Verhulst |
| 7,622,367 B1 | 11/2009 | Nuzzo |
| 7,626,685 B2 | 12/2009 | Jin |
| 7,646,138 B2 | 1/2010 | Williams |
| 7,646,943 B1 | 1/2010 | Wober |
| 7,647,695 B2 | 1/2010 | MacNutt |
| 7,649,665 B2 | 1/2010 | Kempa |
| 7,655,860 B2 | 2/2010 | Parsons |
| 7,663,202 B2 | 2/2010 | Wang |
| 7,692,860 B2 | 4/2010 | Sato |
| 7,704,806 B2 | 4/2010 | Chae |
| 7,713,779 B2 | 5/2010 | Firon |
| 7,719,678 B2 | 5/2010 | Kamins |
| 7,719,688 B2 | 5/2010 | Kamins |
| 7,732,769 B2 | 6/2010 | Snider |
| 7,732,839 B2 | 6/2010 | Sebe |
| 7,736,954 B2 | 6/2010 | Hussain |
| 7,740,824 B2 | 6/2010 | Godfried |
| 7,790,495 B2 | 9/2010 | Assefa |
| 7,872,324 B2 | 1/2011 | Kim |
| 7,888,155 B2 | 2/2011 | Chen |
| 7,902,540 B2 | 3/2011 | Cohen |
| 7,948,555 B2 | 5/2011 | Kwon et al. |
| 7,972,885 B1 | 7/2011 | Dutta |
| 8,030,729 B2 | 10/2011 | Quitoriano |
| 8,035,184 B1 | 10/2011 | Dutta |
| 8,049,203 B2 | 11/2011 | Samuelson |
| 8,063,450 B2 | 11/2011 | Wernersson |
| 8,067,299 B2 | 11/2011 | Samuelson |
| 8,067,736 B2 | 11/2011 | Gruss |
| 8,084,728 B2 | 12/2011 | Tsang |

(56) References Cited

U.S. PATENT DOCUMENTS

| | | |
|---|---|---|
| 8,093,675 B2 | 1/2012 | Tsunemi |
| 8,118,170 B2 | 2/2012 | Sato |
| 8,143,658 B2 | 3/2012 | Samuelson |
| 8,154,127 B1 | 4/2012 | Kamins |
| 8,193,524 B2 | 6/2012 | Bjoerk |
| 8,208,776 B2 | 6/2012 | Tokushima |
| 8,212,136 B2 | 7/2012 | Shirai et al. |
| 8,212,138 B2 | 7/2012 | Landis |
| 8,222,705 B2 | 7/2012 | Ogino |
| 8,242,353 B2 | 8/2012 | Karg |
| 8,269,985 B2 | 9/2012 | Wober |
| 8,274,039 B2 | 9/2012 | Wober |
| 8,299,472 B2 | 10/2012 | Yu |
| 8,330,090 B2 | 12/2012 | Agarwal |
| 8,384,007 B2 | 2/2013 | Yu |
| 8,455,857 B2 | 6/2013 | Samuelson |
| 8,471,190 B2 | 6/2013 | Wober |
| 8,514,411 B2 | 8/2013 | Wober |
| 8,546,742 B2 | 10/2013 | Wober |
| 8,748,799 B2 * | 6/2014 | Wober .............. B82Y 30/00 250/214.1 |
| 8,766,272 B2 | 7/2014 | Yu et al. |
| 8,791,470 B2 | 7/2014 | Wober |
| 8,810,808 B2 | 8/2014 | Wober |
| 8,835,831 B2 | 9/2014 | Yu et al. |
| 8,866,065 B2 | 10/2014 | Wober |
| 9,000,353 B2 | 4/2015 | Seo |
| 2002/0003201 A1 | 1/2002 | Yu |
| 2002/0020846 A1 | 2/2002 | Pi |
| 2002/0021879 A1 | 2/2002 | Lee |
| 2002/0071468 A1 | 6/2002 | Sandstrom |
| 2002/0104821 A1 | 8/2002 | Bazylenko |
| 2002/0109082 A1 | 8/2002 | Nakayama |
| 2002/0117675 A1 | 8/2002 | Mascarenhas |
| 2002/0129761 A1 | 9/2002 | Takami |
| 2002/0130311 A1 | 9/2002 | Lieber |
| 2002/0172820 A1 | 11/2002 | Majumdar |
| 2003/0003300 A1 | 1/2003 | Korgel |
| 2003/0006363 A1 | 1/2003 | Campbell |
| 2003/0077907 A1 | 4/2003 | Kao |
| 2003/0089899 A1 | 5/2003 | Lieber |
| 2003/0103744 A1 | 6/2003 | Koyama |
| 2003/0132480 A1 | 7/2003 | Chau |
| 2003/0160176 A1 | 8/2003 | Vispute |
| 2003/0189202 A1 | 10/2003 | Li |
| 2003/0227090 A1 | 12/2003 | Okabe |
| 2004/0011975 A1 | 1/2004 | Nicoli |
| 2004/0021062 A1 | 2/2004 | Zaidi |
| 2004/0026684 A1 | 2/2004 | Empedocles |
| 2004/0058058 A1 | 3/2004 | Shchegolikhin |
| 2004/0065362 A1 | 4/2004 | Watabe |
| 2004/0075464 A1 | 4/2004 | Samuelson |
| 2004/0095658 A1 | 5/2004 | Buretea |
| 2004/0109666 A1 | 6/2004 | Kim |
| 2004/0114847 A1 | 6/2004 | Fischer et al. |
| 2004/0118337 A1 | 6/2004 | Mizutani |
| 2004/0118377 A1 | 6/2004 | Bloms |
| 2004/0122328 A1 | 6/2004 | Wang |
| 2004/0124366 A1 | 7/2004 | Zeng |
| 2004/0155247 A1 | 8/2004 | Benthien |
| 2004/0156610 A1 | 8/2004 | Charlton |
| 2004/0160522 A1 | 8/2004 | Fossum |
| 2004/0180461 A1 | 9/2004 | Yaung |
| 2004/0213307 A1 | 10/2004 | Lieber |
| 2004/0217086 A1 | 11/2004 | Kawashima |
| 2004/0223681 A1 | 11/2004 | Block |
| 2004/0241965 A1 | 12/2004 | Merritt |
| 2004/0252957 A1 | 12/2004 | Schmidt et al. |
| 2004/0261840 A1 | 12/2004 | Schmit |
| 2005/0009224 A1 | 1/2005 | Yang |
| 2005/0035381 A1 | 2/2005 | Holm |
| 2005/0082676 A1 | 4/2005 | Andry |
| 2005/0087601 A1 | 4/2005 | Gerst |
| 2005/0095699 A1 | 5/2005 | Miyauchi |
| 2005/0109388 A1 | 5/2005 | Murakami |
| 2005/0116271 A1 | 6/2005 | Kato |
| 2005/0133476 A1 | 6/2005 | Islam |
| 2005/0161662 A1 | 7/2005 | Majumdar |
| 2005/0164514 A1 | 7/2005 | Rauf |
| 2005/0190453 A1 | 9/2005 | Dobashi |
| 2005/0201704 A1 | 9/2005 | Ellwood |
| 2005/0218468 A1 | 10/2005 | Owen |
| 2005/0224707 A1 | 10/2005 | Guedj |
| 2005/0242409 A1 | 11/2005 | Yang |
| 2005/0284517 A1 | 12/2005 | Shinohara |
| 2006/0011362 A1 | 1/2006 | Tao |
| 2006/0027071 A1 | 2/2006 | Barnett |
| 2006/0038990 A1 | 2/2006 | Habib |
| 2006/0113622 A1 | 6/2006 | Adkisson |
| 2006/0115230 A1 | 6/2006 | Komoguchi et al. |
| 2006/0121371 A1 | 6/2006 | Wu |
| 2006/0146323 A1 | 7/2006 | Bratkovski |
| 2006/0162766 A1 | 7/2006 | Gee |
| 2006/0180197 A1 | 8/2006 | Gui |
| 2006/0208320 A1 | 9/2006 | Tsuchiya et al. |
| 2006/0257071 A1 | 11/2006 | Bise |
| 2006/0260674 A1 | 11/2006 | Tran |
| 2006/0273262 A1 | 12/2006 | Sayag |
| 2006/0273389 A1 | 12/2006 | Cohen |
| 2006/0284118 A1 | 12/2006 | Asmussen |
| 2007/0012980 A1 | 1/2007 | Duan |
| 2007/0012985 A1 | 1/2007 | Stumbo |
| 2007/0017567 A1 | 1/2007 | Gronet |
| 2007/0023799 A1 | 2/2007 | Boettiger |
| 2007/0025504 A1 | 2/2007 | Tumer |
| 2007/0029545 A1 | 2/2007 | Striakhilev |
| 2007/0052050 A1 | 3/2007 | Dierickx |
| 2007/0076481 A1 | 4/2007 | Tennant |
| 2007/0082255 A1 | 4/2007 | Sun |
| 2007/0099292 A1 | 5/2007 | Miller |
| 2007/0104441 A1 | 5/2007 | Ahn |
| 2007/0107773 A1 | 5/2007 | Fork |
| 2007/0108371 A1 | 5/2007 | Stevens |
| 2007/0114622 A1 | 5/2007 | Adkisson |
| 2007/0120254 A1 | 5/2007 | Hurkx |
| 2007/0126037 A1 | 6/2007 | Ikeda |
| 2007/0137697 A1 | 6/2007 | Kempa |
| 2007/0138376 A1 | 6/2007 | Naughton |
| 2007/0138380 A1 | 6/2007 | Adkisson |
| 2007/0138459 A1 | 6/2007 | Wong |
| 2007/0139740 A1 | 6/2007 | Igura |
| 2007/0140638 A1 | 6/2007 | Yang |
| 2007/0145512 A1 | 6/2007 | Rhodes |
| 2007/0148599 A1 | 6/2007 | True |
| 2007/0152248 A1 | 7/2007 | Choi |
| 2007/0155025 A1 | 7/2007 | Zhang |
| 2007/0164270 A1 | 7/2007 | Majumdar |
| 2007/0170418 A1 | 7/2007 | Bowers |
| 2007/0172623 A1 | 7/2007 | Kresse |
| 2007/0172970 A1 | 7/2007 | Uya |
| 2007/0187787 A1 | 8/2007 | Ackerson |
| 2007/0196239 A1 | 8/2007 | Vink |
| 2007/0200054 A1 | 8/2007 | Reznik |
| 2007/0205483 A1 | 9/2007 | Williams |
| 2007/0217754 A1 | 9/2007 | Sasaki |
| 2007/0228421 A1 | 10/2007 | Shioya |
| 2007/0238265 A1 | 10/2007 | Kurashina |
| 2007/0238285 A1 | 10/2007 | Borden |
| 2007/0241260 A1 | 10/2007 | Jaeger |
| 2007/0246689 A1 | 10/2007 | Ge |
| 2007/0248958 A1 | 10/2007 | Jovanovich |
| 2007/0272828 A1 | 11/2007 | Xu |
| 2007/0278500 A1 | 12/2007 | Lin |
| 2007/0285378 A1 | 12/2007 | Lankhorst |
| 2007/0290193 A1 | 12/2007 | Tucker |
| 2007/0290265 A1 | 12/2007 | Augusto |
| 2008/0001498 A1 | 1/2008 | Muller |
| 2008/0006319 A1 | 1/2008 | Bettge |
| 2008/0029701 A1 | 2/2008 | Onozawa |
| 2008/0035965 A1 | 2/2008 | Hayashi |
| 2008/0036038 A1 | 2/2008 | Hersee |
| 2008/0044984 A1 | 2/2008 | Hsieh |
| 2008/0047601 A1 | 2/2008 | Nag |
| 2008/0047604 A1 | 2/2008 | Korevaar |

(56) References Cited

U.S. PATENT DOCUMENTS

| | | |
|---|---|---|
| 2008/0055451 A1 | 3/2008 | Kanbe |
| 2008/0065451 A1 | 3/2008 | For |
| 2008/0073742 A1 | 3/2008 | Adkisson |
| 2008/0079022 A1 | 4/2008 | Yamamoto |
| 2008/0079076 A1 | 4/2008 | Sheen |
| 2008/0083963 A1 | 4/2008 | Hsu |
| 2008/0088014 A1 | 4/2008 | Adkisson |
| 2008/0090401 A1 | 4/2008 | Bratkovski |
| 2008/0092938 A1 | 4/2008 | Majumdar |
| 2008/0096308 A1 | 4/2008 | Santori |
| 2008/0108170 A1 | 5/2008 | Adkisson |
| 2008/0116537 A1 | 5/2008 | Adkisson |
| 2008/0128760 A1 | 6/2008 | Jun |
| 2008/0137188 A1 | 6/2008 | Sato et al. |
| 2008/0143906 A1 | 6/2008 | Allemand et al. |
| 2008/0145965 A1 | 6/2008 | Reznik |
| 2008/0149914 A1 | 6/2008 | Samuelson |
| 2008/0149944 A1 | 6/2008 | Samuelson |
| 2008/0157253 A1 | 7/2008 | Starikov |
| 2008/0166883 A1 | 7/2008 | Liu |
| 2008/0169017 A1 | 7/2008 | Korevaar |
| 2008/0169019 A1 | 7/2008 | Korevaar |
| 2008/0173615 A1 | 7/2008 | Kim |
| 2008/0178924 A1 | 7/2008 | Kempa |
| 2008/0188029 A1 | 8/2008 | Rhodes |
| 2008/0191278 A1 | 8/2008 | Maekawa |
| 2008/0191298 A1 | 8/2008 | Lin |
| 2008/0211945 A1 | 9/2008 | Hong |
| 2008/0218740 A1 | 9/2008 | Williams |
| 2008/0224115 A1 | 9/2008 | Bakkers |
| 2008/0225140 A1 | 9/2008 | Raynor |
| 2008/0233280 A1 | 9/2008 | Blanchet |
| 2008/0237568 A1 | 10/2008 | Kobayashi |
| 2008/0246020 A1 | 10/2008 | Kawashima |
| 2008/0246123 A1 | 10/2008 | Kamins |
| 2008/0248304 A1 | 10/2008 | Hanrath |
| 2008/0251780 A1 | 10/2008 | Li |
| 2008/0258747 A1 | 10/2008 | Kluth |
| 2008/0260225 A1 | 10/2008 | Szu |
| 2008/0264478 A1 | 10/2008 | Ahn |
| 2008/0266556 A1 | 10/2008 | Kamins |
| 2008/0266572 A1 | 10/2008 | Kamins |
| 2008/0271783 A1 | 11/2008 | Murakami |
| 2008/0277646 A1 | 11/2008 | Kim |
| 2008/0283728 A1 | 11/2008 | Inoue |
| 2008/0283883 A1 | 11/2008 | Shim |
| 2008/0297281 A1 | 12/2008 | Ayazi |
| 2008/0311693 A1 | 12/2008 | Maxwell |
| 2008/0311712 A1 | 12/2008 | Anwar |
| 2009/0001498 A1 | 1/2009 | Wang |
| 2009/0020150 A1 | 1/2009 | Atwater |
| 2009/0020687 A1 | 1/2009 | Lehmann et al. |
| 2009/0032687 A1 | 2/2009 | Lapstun |
| 2009/0046362 A1 | 2/2009 | Guo |
| 2009/0046749 A1 | 2/2009 | Mizuuchi |
| 2009/0050204 A1 | 2/2009 | Habib |
| 2009/0052029 A1 | 2/2009 | Dai et al. |
| 2009/0057650 A1 | 3/2009 | Lieber |
| 2009/0072145 A1 | 3/2009 | Peczalski |
| 2009/0104160 A1 | 4/2009 | Young |
| 2009/0120498 A1 | 5/2009 | Yamazaki |
| 2009/0121136 A1 | 5/2009 | Gruss |
| 2009/0127442 A1 | 5/2009 | Lee |
| 2009/0146198 A1 | 6/2009 | Joe |
| 2009/0151782 A1 | 6/2009 | Ko |
| 2009/0152664 A1 | 6/2009 | Klem |
| 2009/0153961 A1 | 6/2009 | Murakami |
| 2009/0165844 A1 | 7/2009 | Dutta |
| 2009/0173976 A1 | 7/2009 | Augusto |
| 2009/0179225 A1 | 7/2009 | Fertig |
| 2009/0179289 A1 | 7/2009 | Park |
| 2009/0188552 A1 | 7/2009 | Wang |
| 2009/0189144 A1 | 7/2009 | Quitoriano |
| 2009/0189145 A1 | 7/2009 | Wang |
| 2009/0194160 A1 | 8/2009 | Chin |
| 2009/0199597 A1 | 8/2009 | Danley |
| 2009/0201400 A1 | 8/2009 | Zhang |
| 2009/0206405 A1 | 8/2009 | Doyle |
| 2009/0211622 A1 | 8/2009 | Frolov |
| 2009/0223558 A1 | 9/2009 | Sun |
| 2009/0224245 A1 | 9/2009 | Umezaki |
| 2009/0224349 A1 | 9/2009 | Gambino |
| 2009/0230039 A1 | 9/2009 | Hoenig |
| 2009/0233445 A1 | 9/2009 | Lee |
| 2009/0242018 A1 | 10/2009 | Ahn |
| 2009/0243016 A1 | 10/2009 | Kawahara |
| 2009/0244514 A1 | 10/2009 | Jin |
| 2009/0260687 A1 | 10/2009 | Park |
| 2009/0261438 A1 | 10/2009 | Choi |
| 2009/0266418 A1 | 10/2009 | Hu |
| 2009/0266974 A1 | 10/2009 | Verhulst |
| 2009/0272423 A1 | 11/2009 | Niira |
| 2009/0278954 A1 | 11/2009 | Kanamori |
| 2009/0278998 A1 | 11/2009 | El-Ghoroury |
| 2009/0289320 A1 | 11/2009 | Cohen |
| 2009/0305454 A1 | 12/2009 | Cohen |
| 2010/0006817 A1 | 1/2010 | Ohlsson |
| 2010/0019252 A1 | 1/2010 | Bratkovski |
| 2010/0019296 A1 | 1/2010 | Cha |
| 2010/0019355 A1 | 1/2010 | Kamins |
| 2010/0025710 A1 | 2/2010 | Yamada |
| 2010/0072577 A1 | 3/2010 | Nuzzo et al. |
| 2010/0078055 A1 | 4/2010 | Vidu |
| 2010/0078056 A1 | 4/2010 | Hovel |
| 2010/0090341 A1 | 4/2010 | Wan |
| 2010/0101633 A1 | 4/2010 | Park |
| 2010/0104494 A1 | 4/2010 | Meng |
| 2010/0110433 A1 | 5/2010 | Nedelcu et al. |
| 2010/0116976 A1 | 5/2010 | Wober |
| 2010/0126573 A1 | 5/2010 | Youtsey |
| 2010/0127153 A1 | 5/2010 | Agarwal |
| 2010/0132779 A1 | 6/2010 | Hong |
| 2010/0133986 A1 | 6/2010 | Kim |
| 2010/0136721 A1 | 6/2010 | Song |
| 2010/0148221 A1 | 6/2010 | Yu |
| 2010/0163714 A1 | 7/2010 | Wober |
| 2010/0163941 A1 | 7/2010 | Jung |
| 2010/0178018 A1 | 7/2010 | Augusto |
| 2010/0186809 A1 | 7/2010 | Samuelson |
| 2010/0187404 A1 | 7/2010 | Klem |
| 2010/0200065 A1 | 8/2010 | Choi |
| 2010/0207103 A1 | 8/2010 | Farrow |
| 2010/0218816 A1 | 9/2010 | Guha |
| 2010/0221866 A1 | 9/2010 | Graham et al. |
| 2010/0229939 A1 | 9/2010 | Shen |
| 2010/0230653 A1 | 9/2010 | Chen |
| 2010/0237454 A1 | 9/2010 | Fujisawa |
| 2010/0240104 A1 | 9/2010 | Zhang et al. |
| 2010/0244108 A1 | 9/2010 | Kohnke |
| 2010/0244169 A1 | 9/2010 | Maeda |
| 2010/0249877 A1 | 9/2010 | Naughton |
| 2010/0258184 A1 | 10/2010 | Laughlin |
| 2010/0276572 A1 | 11/2010 | Iwabuchi |
| 2010/0277607 A1 | 11/2010 | Choi |
| 2010/0282314 A1 | 11/2010 | Coakley |
| 2010/0295019 A1 | 11/2010 | Wang |
| 2010/0302440 A1 | 12/2010 | Wober |
| 2010/0304061 A1 | 12/2010 | Ye |
| 2010/0308214 A1 | 12/2010 | Wober |
| 2010/0313952 A1 | 12/2010 | Coakley |
| 2010/0319763 A1 | 12/2010 | Park |
| 2010/0320444 A1 | 12/2010 | Dutta |
| 2011/0018424 A1 | 1/2011 | Takada |
| 2011/0036396 A1 | 2/2011 | Jayaraman |
| 2011/0037133 A1 | 2/2011 | Su |
| 2011/0049572 A1 | 3/2011 | Jeon et al. |
| 2011/0050042 A1 | 3/2011 | Choi |
| 2011/0057231 A1 | 3/2011 | Jeon et al. |
| 2011/0057234 A1 | 3/2011 | Jeon et al. |
| 2011/0057286 A1 | 3/2011 | Jeon et al. |
| 2011/0076847 A1 | 3/2011 | Aqui |
| 2011/0080508 A1 | 4/2011 | Katsuno |
| 2011/0084212 A1 | 4/2011 | Clark |
| 2011/0127490 A1 | 6/2011 | Mi |

(56) References Cited

U.S. PATENT DOCUMENTS

| | | |
|---|---|---|
| 2011/0133060 A1 | 6/2011 | Yu |
| 2011/0133160 A1 | 6/2011 | Yu |
| 2011/0135814 A1 | 6/2011 | Miyauchi |
| 2011/0139176 A1 | 6/2011 | Cheung |
| 2011/0146771 A1 | 6/2011 | Chuang |
| 2011/0147870 A1 | 6/2011 | Ang |
| 2011/0180894 A1 | 7/2011 | Samuelson |
| 2011/0195577 A1 | 8/2011 | Kushibiki |
| 2011/0220191 A1 | 9/2011 | Flood |
| 2011/0226937 A1 | 9/2011 | Yu |
| 2011/0248315 A1 | 10/2011 | Nam |
| 2011/0249219 A1 | 10/2011 | Evans |
| 2011/0249322 A1 | 10/2011 | Wang |
| 2011/0253982 A1 | 10/2011 | Wang |
| 2011/0272014 A1 | 11/2011 | Mathai |
| 2011/0297214 A1 | 12/2011 | Kim |
| 2011/0309237 A1 | 12/2011 | Seo et al. |
| 2011/0309240 A1 | 12/2011 | Yu et al. |
| 2011/0309331 A1 | 12/2011 | Yu |
| 2011/0315988 A1 | 12/2011 | Yu |
| 2011/0316106 A1 | 12/2011 | Kim |
| 2012/0006390 A1 | 1/2012 | Huo et al. |
| 2012/0009714 A1 | 1/2012 | Mouli |
| 2012/0014837 A1 | 1/2012 | Fehr et al. |
| 2012/0029328 A1 | 2/2012 | Shimizu |
| 2012/0031454 A1 | 2/2012 | Fogel |
| 2012/0060905 A1 | 3/2012 | Fogel |
| 2012/0075513 A1 | 3/2012 | Chipman et al. |
| 2012/0153124 A1 | 6/2012 | Yu |
| 2012/0168613 A1 | 7/2012 | Yu |
| 2012/0192939 A1 | 8/2012 | Tamboli et al. |
| 2012/0196383 A1 | 8/2012 | Nitkowski et al. |
| 2012/0196401 A1 | 8/2012 | Graham |
| 2012/0240999 A1 | 9/2012 | Yoshida |
| 2012/0258563 A1 | 10/2012 | Ogino |
| 2012/0280345 A1 | 11/2012 | Zhu |
| 2012/0291859 A1 | 11/2012 | Vineis |
| 2012/0298843 A1 | 11/2012 | Yu |
| 2012/0313073 A1 | 12/2012 | McKone et al. |
| 2012/0313078 A1 | 12/2012 | Fukui |
| 2012/0318336 A1 | 12/2012 | Hekmatshoar-Tabari et al. |
| 2012/0322164 A1 | 12/2012 | Lal |
| 2013/0000704 A1 | 1/2013 | Fogel |
| 2013/0020620 A1 | 1/2013 | Wober |
| 2013/0037100 A1 | 2/2013 | Platzer Bjorkman |
| 2013/0112256 A1 | 5/2013 | Yu |
| 2013/0125965 A1 | 5/2013 | Hazeghi et al. |
| 2013/0174896 A1 | 7/2013 | Ardo et al. |
| 2013/0174904 A1 | 7/2013 | Yamasaki |
| 2013/0220406 A1 | 8/2013 | Day |
| 2013/0341749 A1 | 12/2013 | Yu et al. |
| 2014/0045209 A1 | 2/2014 | Chou |
| 2014/0096816 A1 | 4/2014 | Atwater et al. |
| 2014/0117401 A1 | 5/2014 | Herner |
| 2015/0171272 A1 | 6/2015 | Luo |

FOREIGN PATENT DOCUMENTS

| | | |
|---|---|---|
| CN | 100350429 | 11/2007 |
| CN | 101221993 | 7/2008 |
| CN | 101459185 | 6/2009 |
| CN | 100568516 | 12/2009 |
| CN | 101675522 | 3/2010 |
| CN | 101681941 | 3/2010 |
| CN | 103201858 | 7/2013 |
| EP | 1367819 | 12/2003 |
| EP | 0809303 B1 | 9/2006 |
| FR | 2923651 | 5/2009 |
| GB | 2348399 A | 4/2000 |
| JP | 359013708 A | 1/1984 |
| JP | 59198413708 | 1/1984 |
| JP | 2000324396 | 11/2000 |
| JP | 2002151715 A | 5/2002 |
| JP | 2005252210 A | 9/2005 |
| JP | 2005328135 | 11/2005 |
| JP | 2007134562 | 5/2007 |
| JP | 2007152548 | 6/2007 |
| JP | 2007184566 | 7/2007 |
| JP | 2007520877 | 7/2007 |
| JP | 2007201091 | 8/2007 |
| JP | 2007317961 | 12/2007 |
| JP | 2008288585 | 11/2008 |
| JP | 2009506546 | 2/2009 |
| JP | 2009236914 | 10/2009 |
| JP | 2012543250 | 4/2013 |
| JP | 2013513253 | 4/2013 |
| JP | 2013513254 | 4/2013 |
| TW | I318418 | 5/2004 |
| TW | I228782 | 3/2005 |
| TW | 200535914 | 11/2005 |
| TW | 200536048 | 11/2005 |
| TW | 200742115 | 4/2007 |
| TW | 200810100 | 2/2008 |
| TW | 200814308 | 3/2008 |
| TW | 200845402 | 11/2008 |
| TW | 200847412 | 12/2008 |
| TW | 200915551 | 4/2009 |
| TW | 200941716 | 10/2009 |
| TW | I320235 | 2/2010 |
| TW | 201027730 | 7/2010 |
| TW | 201034172 | 9/2010 |
| TW | 201044610 | 12/2010 |
| TW | 201140859 | 11/2011 |
| WO | 8603347 A1 | 6/1986 |
| WO | 0002379 | 1/2000 |
| WO | 02069623 | 9/2002 |
| WO | 03107439 | 12/2003 |
| WO | 03107439 A1 | 12/2003 |
| WO | 2005064337 | 7/2005 |
| WO | 2007000879 | 1/2007 |
| WO | 2008069565 | 6/2008 |
| WO | 2008079076 | 7/2008 |
| WO | 2008079076 A1 | 7/2008 |
| WO | 2008131313 A2 | 10/2008 |
| WO | 2008135905 | 11/2008 |
| WO | 2008135905 A2 | 11/2008 |
| WO | 2008135905 A3 | 11/2008 |
| WO | 2008143727 A2 | 11/2008 |
| WO | 2008131313 | 12/2008 |
| WO | 2009099841 | 8/2009 |
| WO | 2009116018 A2 | 9/2009 |
| WO | 2009137241 A2 | 11/2009 |
| WO | 2010014099 | 2/2010 |
| WO | 2010019887 A1 | 2/2010 |
| WO | 2010039631 A1 | 4/2010 |
| WO | 2010067958 | 8/2010 |
| WO | 2011074457 | 6/2011 |

OTHER PUBLICATIONS

Adler, Nanowire Lawns Make for Sheets of Image Sensors, NewScientist.com, Jul. 28, 2008.

Babinec et al., High-Flux, Low-Power Diamond Nanowire Single-Photon Source Arrays: An Enabling Material for Optical and Quantum Computing and Cryptography, obtained on Jul. 22, 2010 at URL: http://otd.harvard.edu/technologies/tech.php?case=3702.

Baillie et al., 'Zero-space microlenses for CMOS image sensors: optical modeling and lithographic process development', Publication Date May 2004, http://adsabs.harvard.edu/abs/2004SPIE. 5377..953B, pp. 1-2.

Baomin, et al., Nanotechology 23 (2012) 194003, 7 pages.

Barclay et al., Chip-Based Microcavities Coupled to NV Centers in Single Crystal Diamond, Applied Physics Letters, Nov. 12, 2009, vol. 95, Issue 19.

Brouri et al., Photon Antibunching in the Flurescence of Individual Colored Centers in Diamond, Optics Letters, Sep. 1, 2000, vol. 25, Issue 17.

Canadian Office Action of Canadian Application No. 3,676,376, dated Oct. 11, 2013.

Catrysse, et al., An Integrated Color Pixel in 0.18pm CMOS Technology, Proceedings IEDM 2001, pp. 559-562.

(56) References Cited

OTHER PUBLICATIONS

Choi et al., Optimization of sidewall roughness in silica waveguides to reduce propagation losses, May 2001, Lasers and Electro-Optics, 2001. CLEO '01. Technical Digest. Summaries of papers presented at the Conference on, pp. 175-176.
Chung, Sung-Wook et al. Silicon Nanowire Devices. Applied Physics Letters, vol. 76, No. 15 (Apr. 10, 2000), pp. 2068-2070.
CMOS image sensor pixel optical efficiency and optical crosstalk optimization using FDTD Solutions www.lumerical.com/fdtd_microlens/cmos_image_sensor_pixel_microlens.php, Mar. 19, 2009.
Deptuch et al., Vertically Integrated Circuits at Fermilab, IEEE Transactions on Nuclear Science, Aug. 2010, vol. 54, Issue 4, pp. 2178-2186.
Ekroll, On the Nature of Simultaneous Color Contrast, Dissertation, University of Kiel, 2005.
Fan et al., Large-Scale, Heterogeneous Integration of Nanowire Arrays for Image Sensor Circuitry, Proceedings of the National Academy of Sciences (PNAS) of the United States of America, Aug. 12, 2008, vol. 105, No. 32.
Fang et al., Fabrication of Slantingly-Aligned Silicon Nanowire Arrays for Solar Cell Applications, Nanotechnology, vol. 19, No. 25. 2008.
Furumiya, et al. 'High-sensitivity and no-crosstalk pixel technology for embedded CMOS image sensor'; IEEE Electron Device Letters, vol. 48, No. 10, Oct. 2001.
Gadelrab et al., The Source-Gated Amorphous Silicon Photo-Transistor, IEEE Transactions on Electron Devices, Oct. 1997, vol. 44, No. 10, pp. 1789-1794.
Gambino et al., 'CMOS Imager with Copper Wiring and Lightpipe,' Electron Devices Meeting, 2006. IEDM '06, International Publication Date: Dec. 11-13, 2006, pp. 1-4.
Garnett et al., Light Trapping in Silicon Nanowire Solar Cells, Nanoletters, Jan. 28, 2010, vol. 10, No. 3, pp. 1082-1087.
Ge et al., Orientation-Controlled Growth of Single-Crystal Silicon-Nanowire Arrays, Advanced Materials, Jan. 18, 2005, vol. 17, No. 1, pp. 56-61.
Geyer et al., Model for the Mass Transport during Metal-Assisted Chemical Etching with Contiguous Metal Films as Catalysts, J. Phys. Chem. C 2012, 116, 13446-13451.
Guillaumee, et al.; Polarization Sensitive Silicon Photodiodes Using Nanostructured Metallic Grids, Applied Physics Letters 94, 2009.
Hanrath et al., Nucleation and Growth of Germanium Nanowires Seeded by Organic Monolayer-Coated Gold Nanocrystals, J. Am. Chem. Soc., Feb. 20, 2002, vol. 124, No. 7, pp. 1424-1429.
Hanrath et al., Supercritical Fluid-Liquid-Solid (SFLS) Synthesis of Si and Ge Nanowires Seeded by Colloidal Metal Nanocrystals, Advanced Materials, Mar. 4, 2003, vol. 15, No. 5, pp. 437-440.
Hochbaum et al., Controlled Growth of Si Nanowire Arrays for Device Integration, Nano Letters, Mar. 2005, vol. 5, No. 3, pp. 457-460.
Holmes et al., Control of Thickness and Orientation of Solution-Grown Silicon Nanowires, Science, Feb. 25, 2000, vol. 287, No. 5457, pp. 1471-1473.
Hopkins, Addressing sidewall roughness using dry etching silicon and Si02, Jul. 1, 2004, ElectroIQ, vol. 47, Issue 7.
Hsu, et al. 'Light Guide for Pixel Crosstalk Improvement in Deep Submicron CMOS Image Sensor'; IEEE Electron Device Letters, vol. 25, No. 1, Jan. 2004.
International Preliminary Report and Written Opinion re PCT/US2010/059468, mailed Jun. 21, 2012.
International Preliminary Report and Written Opinion re PCT/US2010/059491, mailed Jun. 21, 2012.
International Preliminary Report and Written Opinion re PCT/US2010/059496, mailed Jun. 21, 2012.
Office Action issued on Mar. 3, 2014 in Chinese Application No. 200980142671.9.
International Preliminary Report on Patentability for PCT International Application No. PCT/US2010/035722, mailed Nov. 3, 2011.
International Preliminary Report on Patentability for PCT International Patent Application No. PCT/U62009/055963, mailed Mar. 17, 2011.
International Preliminary Search Report on Patentability of PCT/US2011/057325, mailed May 2, 2013 (9 pages).
International Search Report and Written Opinion for PCT International Application No. PCT/US2010/035722, mailed Jul. 20, 2010.
International Search Report and Written Opinion for PCT International Application No. PCT/US2010/035726, mailed Jul. 21, 2010.
International Search Report and Written Opinion for PCT International Patent Application No. PCT/US2009/055963, mailed Oct. 15, 2009.
International Search Report and Written Opinion for PCT International Patent Application No. PCT/US2009/063592, mailed Jan. 13, 2010.
International Search Report and Written Opinion for PCT International Patent Application No. PCT/US2010/035727, mailed Sep. 27, 2010.
International Search Report and Written Opinion for PCT International Patent Application No. PCT/US2010/051435, mailed Dec. 3, 2010.
International Search Report and Written Opinion for PCT International Patent Application No. PCT/US2010/051446, mailed Jan. 3, 2011.
International Search Report and Written Opinion for PCT International Patent Application No. PCT/US2010/057227, mailed Jan. 26, 2011.
International Search Report and Written Opinion for PCT International Patent Application No. PCT/US2010/059468, mailed Feb. 11, 2011.
International Search Report and Written Opinion for PCT International Patent Application No. PCT/US2010/059491, mailed Feb. 9, 2011.
International Search Report and Written Opinion for PCT International Patent Application No. PCT/US2010/059501, mailed Feb. 15, 2011.
International Search Report and Written Opinion for PCT International Patent Application No. PCT/US2010/059504, mailed Apr. 7, 2011.
International Search Report and Written Opinion for PCT International Patent Application No. PCT/US2011/060348, mailed Mar. 9, 2012.
International Search Report and Written Opinion for PCT International Patent Application No. PCT/US2011/064635, mailed Apr. 13, 2012.
International Search Report and Written Opinion for PCT International Patent Application No. PCT/US2011/066097, mailed Mar. 12, 2012.
International Search Report and Written Opinion for PCT International Patent Application No. PCT/US2011/067712, mailed May 3, 2012.
International Search Report and Written Opinion re PCT/US2011/57325, mailed Jun. 22, 2012.
Jeong, et al., Nano Lett. 2012, 12, 2971-2976.
Jeong et al., J. Vac. Sci. Technol. A 30(6), Nov./Dec. 2012.
Jin-Kon Kim; 'New Functional Nanomaterials Based on Block Copolymers' http://www.ziu.edu.cn/adver/subjectizyhd/jz0707061313.html, Jul. 11, 2007.
Juan et al., High Aspect Ratio Polymide Etching Using an Oxygen Plasma Generated by Electron Cyclotron Resonance Source, Journal of Vacuum Science and Technology, Jan./Feb. 1994, vol. 12, No. 1., pp. 422-426.
Junger, et al., Polarization- and wavelength-sensitive sub-wavelength structures fabricated in the metal layers of deep submicron CMOS processes, Proc. of SPIE, vol. 7712, 2010.
Kalkofen et al., Atomic Layer Deposition of Boron Oxide As Dopant Source for Shallow Doping Silicon, Meeting Abstract 943, 217th ECS Meeting MP2010-O1, Apr. 25-30, 2010 Vancouver Canada, El-Advanced Gate Stack, Source / Drain, and Channel Engineering for Si-Based CMOS 6: New Materials, Processes,and Equipment.
Kane, Why Nanowires Make Great Photodetectors, EurekAlert.com article, Apr. 25, 2007.

(56) References Cited

OTHER PUBLICATIONS

Kempa, Thomas J. et al. Single and Tandem Axial p-i-n Nanowire Photovoltaic Devices, Nano Letters, 2008, vol. 8, No. 10, 3456-3460.
Kim et al., Electronic Structure of Vertically Aligned Mn-Doped CoFe2O4 Nanowires and Their Application as Humidity Sensors and Photodetectors, Journal of Physical Chemistry C, Apr. 7, 2009.
Law et al., Semiconductor Nanowires and Nanotubes, Annu. Rev. Mater. Res., 2004, vol. 34, pp. 83-122.
Lee et al., Vertical Pillar-Superlattice Array and Graphene Hybrid Light Emitting Diodes, Nano Letters, 2010, vol. 10, pp. 2783-2788.
Lin et al., Fabrication of Nanowire Anisotropic Conductive Film for Ultra-fine Pitch Flip Chip Interconnection, Electronic Components and Technology Conference, Jun. 20, 2005, 55th Proceedings, pp. 66-70.
Lin et al., Reducing Dark Current in a High-Speed Si-Based Interdigitated Trench-Electrode MSM Photodetector, IEEE Transactions on Electron Devices, May 2003, vol. 50, No. 5, pp. 1306-1313.
Loncar et al., Diamond Nanotechnology, SPIE Newsroom, May 18, 2010, obtained at url: http://spie.org/x40194.xml?ArticleID=x40194.
Loose et al., CMOS Detector technology, Scientific Technology, Scientific Detector Workshop, Sicily 2005, Experimental Astronomy, vol. 19, Issue 1-3, pp. 111-134.
Lu et al., Growth of Single Crystal Silicon Nanowires in Supercritical Solution from Tethered Gold Particles on a Silicon Substrate, NanoLetters, Jan. 2003, vol. 3, No. 1, pp. 93-99.
Lugstein et al., Ga/Au Alloy Catalyst for Single Crystal Silicon-Nanowire Epitaxy, Applied Physics Letters, Jan. 8, 2007, vol. 90, No. 2, pp. 023109-1-023109-3.
Madou, Properties and Growth of Silicon, Including Crystalline Silicon, Fundamentals of Microfabrication, 2nd Ed., Press, 2002, pp. 125-204. CRC.
Makarova et al., Fabrication of High Density, High-Aspect-Ratio Polyimide Nanofilters, Journal of Vacuum Science and Technology, Nov./Dec. 2009, vol. 27, No. 6., pp. 2585-2587.
Mei-Ling Kuo et al. "Realization of a near-perfect antireflection coating for silicon solar energy utilization" (Nov. 1, 2008, vol. 33, No. 21, Optics Letters).
Morales et al., A Laser Ablation Method for the Synthesis of Crystalline Semiconductor Nanowires, Science, Jan. 9, 1998, vol. 279, pp. 208-211.
Mukhopadhyay, When PDMS Isn't the Best, American Chemical Society, May 1, 2007.
N. L. Dmitruk, et al.; 'Modeling and Measurement of Optical Response of 1D Array of Metallic Nanowires for Sensing and Detection Application'; 26th International Conference on Microelectronics (MIEL 2008), NIS, Serbia, May 11-14, 2008.
Nguyen et al., Deep Reactive Ion etching of Polyimide for Microfluidic Applications, Journal of the Korean Physical Society, Sep. 2007, vol. 51, No. 3, pp. 984-988.
Ozgur Yavuzcetin, et al.; 'Index-tuned Anti-reflective Coating using a Nanostructured Metamaterial'; http://www.umass.edu/research/rld/bioportal/vuewtech.php?tid=40, Feb. 28, 2007.
Pain et al., A Back-Illuminated Megapixel CMOS Image Sensor, IEEE Workshop on Charge-Coupled Devices and Advanced Image Sensors, Karuizawa, Japan, Jun. 9-11, 2005, Jet Propulsion Laboratory, National Aeronautics and Space Administration, Pasadena California.
Parraga et al., Color and Luminance Information in Natural Scenes, Journal of Optical Society of America A, Optics, Image, Science and Vision, Jun. 1998, vol. 15, No. 6.
Reynard Corporation; 'Anti-Reflection Coatings (AR)', http://www.reynardcorp.com/coating_anti_reflection.php, dowwnloaded Jun. 4, 2009.
Rosfjord et al., Nanowire Single-Photon Detector with an Integrated Optical Cavity and Anti-Reflection Coating, Optics Express: The International Electronic Journal of Optics; Jan. 23, 2006, vol. 14, No. 2, pp. 527-534.
Rugani, First All-Nanowire Sensor, Technology Review, Aug. 13, 2008, Published by MIT.
Rutter, Diamond-Based Nanowire Devices Advance Quantum Science, SEAS Communications, Feb. 14, 2010, obtained at url:http://news.harvard.edu/gazette/story/2010/02/digging-deep-into-diamonds/.
Sarkar et al., Integrated polarization-analyzing CMOS image sensor for detecting incoming light ray direction, Sensors Application Symposium (SAS), Mar. 29, 2012, p. 194-199, 1010 IEEE.
Schmidt et al., Realization of a Silicon Nanowire Vertical Surround-Gate Field-Effect Transistor, Small, Jan. 2006, vol. 2, No. 1, pp. 85-88.
Seo, et. al., "Multicolored vertical silicon nanowires," Nano Letters, vol. 11 issue 4, pp. 1851-1856, 2010.
Shimizu et al., Homoepitaxial Growth of Vertical Si Nanowires on Si(100) Substrate using Anodic Aluminum Oxide Template, (abstract only), Materials Research Society, Fall 2007.
Shockley, et al., Detailed Balance Limit of Efficiency of p-n Junction Solar Cells, J. of Appl. Physics, vol. 32, No. 3, Mar. 1961, 10 pages.
Song et al., Vertically Standing Ge Nanowires on GaAs(110) Substrates, Nanotechnology 19, Feb. 21, 2008.
Taiwanese Office Action of Taiwan Patent Application No. 099116881, issued Jul. 18, 2013 (8 pages).
Thelander et al., Nanowire-Based One-Dimensional Electronics, Materials Today, Oct. 2006, vol. 9, No. 10, pp. 28-35.
Trentler, Timothy J. et al. Solution-Liquid-Solid Growth of Cyrstalline III-V Semiconductors: An Analogy to Vapor Liquid-Solid Growth. vol. 270(5243), Dec. 15, 1995, pp. 1791-1794.
Tseng, et al. Crosstalk improvement technology applicable to 0.14m CMOS image sensor; IEEE International Electron Devices Meeting, Dec. 13-15, 2004; IEDM Technical Digest, pp. 997-1000.
U.S. Final Office Action for U.S. Appl. No. 12/966,514, mailed Mar. 19, 2013, 50 pages.
U.S. Final Office Action for U.S. Appl. No. 13/494,661, mailed Mar. 7, 2013, 10 pages.
U.S. Office Action for U.S. Appl. No. 12/573,582, dated Jun. 28, 2012.
U.S. Office Action for U.S. Appl. No. 12/633,313, dated Aug. 1, 2013, 20 pages.
U.S. Office Action for U.S. Appl. No. 12/966,514, dated Aug. 15, 2013, 17 pages.
U.S. Office Action for U.S. Appl. No. 12/966,535, mailed Jun. 14, 2013, 22 pages.
U.S. Office Action for U.S. Appl. No. 12/966,573, dated Aug. 6, 2013, 13 pages.
U.S. Office Action for U.S. Appl. No. 13/048,635, mailed Jun. 6, 2013, 24 pages.
U.S. Office Action for U.S. Appl. No. 13/494,661, notification date Nov. 7, 2012.
Verheijen, Marcel A. et al. Growth Kinetics of Heterostructured GaP-GaAs Nanowires. J. Am, Chem. Soc. 2006, 128, 1353-1359.
Wagner et al., Vapor-Liquid-Solid Mechanism of Single Crystal Growth, Applied Physics Letters, Mar. 1, 1964, vol. 4, No. 5, pp. 89-90.
Wang, Introduction to Nanotechnology—Where Opportunities arise & Great Future Being Built from Small Things, Fall 2008.
Wong et al., Lateral Nanoconcentrator Nanowire Multijunction Photovoltaic Cells, GCEP Progress report, Apr. 20, 2009, pp. 1-18.
Ye et al., Fabrication Techniques of High Aspect Ratio Vertical Lightpipes Using a Dielectric Photo Mask, SPIE, Proceedings, Feb. 2010, vol. 7591.
Zhang et al., Ultrahigh Responsivity Visible and Infrared Detection Using Silicon Nanowire Phototransistors, Nanoletters, May 14, 2010, vol. 10, No. 6, pp. 2117-2120.
Office Action issued on Jan. 28, 2014 in Taiwanese Application No. 100146327.
Office Action issued on Mar. 17, 2014 in Korean Application No. 10-2013-7018243.
U.S. Office Action for U.S. Appl. No. 12/910,664, mailed Feb. 26, 2014.
U.S. Office Action for U.S. Appl. No. 12/966,514, mailed Feb. 25, 2014.

(56) References Cited

OTHER PUBLICATIONS

U.S. Office Action for U.S. Appl. No. 14/021,672 mailed May 9, 2014.
U.S. Office Action for U.S. Appl. No. 12/945,492 mailed May 13, 2014.
U.S. Office Action for U.S. Appl. No. 12/966,514 mailed Sep. 23, 2014.
Berstein et al., "Modern Physics", Chapter 14, Section 6, pp. 420-421, 2000, Prentice-Hall, Inc.
University of California San Diego, Class ECE 183 Lab 1, 2013.
U.S. Office Action for U.S. Appl. No. 13/693,207 mailed Oct. 9, 2014.
Office Action issued on Jun. 24, 2014 in Taiwanese Application No. 098129911.
Office Action for U.S. Appl. No. 12/966,514 mailed Nov. 2, 2015.
Office Action for U.S. Appl. No. 12/633,313 mailed Oct. 21, 2015.
Office Action for U.S. Appl. No. 13/963,847 mailed Sep. 1, 2015.
Office Action for U.S. Appl. No. 12/945,492 mailed Sep. 9, 2015.
Office Action for U.S. Appl. No. 14/459,398 mailed Sep. 16, 2015.
Office Action for U.S. Appl. No. 14/274,448 mailed Aug. 26, 2015.
Office Action for U.S. Appl. No. 13/288,131 mailed Oct. 22, 2015.
Office Action for U.S. Appl. No. 14/450,815 mailed Oct. 28, 2015.
Office Action for U.S. Appl. No. 12/945,429 mailed Sep. 4, 2015.
Office Action issued on Oct. 29, 2014 in Korean Application No. 10-2013-7020107.
Corrected Notice of Allowability issued on Oct. 14, 2014 in U.S. Appl. No. 12/966,535.
U.S. Office Action for U.S. Appl. No. 13/543,307 mailed Dec. 24, 2014.
U.S. Office Action for U.S. Appl. No. 14/274,448 mailed Dec. 5, 2014.
International Search Report and Written Opinion for International Application No. PCT/US2014/056558 mailed Dec. 12, 2014.
Office Action issued on Nov. 11, 2014 in Taiwanese Application No. 098129911.
Notice of Allowance issued on Dec. 1, 2014 in U.S. Appl. No. 12/910,664.
Office Action issued Feb. 23, 2015 in U.S. Appl. No. 13/925,429.
Notice of Allowance issued Jan. 30, 2015 in U.S. Appl. No. 14/487,375.
International Search Report and Written Opinion for International Application No. PCT/US2014/050544 mailed Jan. 9, 2015.
Office Action for U.S. Appl. No. 12/982,269, mailed Jan. 15, 2015.
Office Action for U.S. Appl. No. 12/945,492 mailed Jan. 16, 2015.
Office Action for U.S. Appl. No. 13/963,847 mailed Mar. 12, 2015.
Office Action for U.S. Appl. No. 12/966,514 mailed Mar. 10, 2015.
Office Action issued on Jan. 16, 2015 in Chinese Application No. 201180054442.9.
Office Action issued on Mar. 4, 2015 in U.S. Appl. No. 13/556,041.
Office Action for U.S. Appl. No. 14/281,108 mailed Apr. 6, 2015.
Office Action for U.S. Appl. No. 14/450,812 mailed Apr. 1, 2015.
Office Action for U.S. Appl. No. 12/633,313 mailed Apr. 9, 2015.
Bernstein et al. "Modern Physics", Chapter 14, Section 6, pp. 420-421, 2000 by Prentice-Hall Inc.
Kosonocky, et al., 160×244 Element PtSi Schottky-Barrier IR-CCD Image Sensor, IEEE Transactions on Electron Devices, vol. Ed-32, No. 8, Aug. 1985.
Office Action issued May 22, 2015 in Taiwanese Application No. 099142971.
Office Action mailed May 26, 2015 in Japanese Application No. 2014 138265.
Office Action for U.S. Appl. No. 14/068,864 mailed Jun. 15, 2015.
Office Action issued on May 5, 2015 in Chinese Application No. 201410264248.9.
Office Action for U.S. Appl. No. 14/450,812 mailed Jul. 23, 2015.
Office Action for U.S. Appl. No. 14/293,164 mailed Aug. 14, 2015.
Office Action issued Jul. 9, 2015 in Taiwanese Application No. 102124069.

A. Gu et al., "Design and growth of III-V nanowire solar cell arrays on low cost substrates," Conf. Record, 35rd IEEE Photovoltaic Specialists Conference, Honolulu, Jun. 2010, pp. 20-25.
Office Action issued Jun. 23, 2015 in Chinese Application No. 201310284409.6.
Office Action issued Aug. 12, 2015 in Chinese Application No. 201180054442.9.
Office Action mailed Sep. 30, 2015 in Japanese Application No. 2014-094365.
Office Action for U.S. Appl. No. 14/450,812 mailed Oct. 28, 2015.
Office Action dated Oct. 6, 2015 in Taiwanese Application No. 100141376.
Office Action dated Sep. 11, 2015 in Taiwanese Application No. 103143553.
International Search Report and Written Opinion mailed Nov. 27, 2015 in International Application No. PCT/US2015/038999.
Office Action for U.S. Appl. No. 12/633,313 mailed Aug. 1, 2014.
Office Action issued on Jun. 19, 2014 in Taiwanese Application No. 099133891.
U.S. Office Action for U.S. Appl. No. 12/982,269 mailed Jun. 11, 2014.
U.S. Office Action for U.S. Appl. No. 13/106,851 mailed May 29, 2014.
U.S. Office Action for U.S. Appl. No. 13/556,041 mailed Jun. 12, 2014.
Office Action for U.S. Appl. No. 13/693,207 mailed May 7, 2015.
Kim, Y.S. et al., "ITO/AU/ITO multilayer thin films for transparent conducting electrode applications", Applied Surface Science, vol. 254 (2007), pp. 1524-1527.
Philipp, H.R. et al., "Optical Constants of Silicon in the Region 1 to 10 ev", Physical Review, vol. 120, No. 1, pp. 37-38.
Office Action for U.S. Appl. No. 13/543,307 mailed Apr. 17, 2015.
Office Action issued Mar. 19, 2015 in Chinese Application No. 201180065814.8.
Office Action for U.S. Appl. No. 13/288,131 mailed Apr. 17, 2015.
Office Action issued on Mar. 18, 2015 in Chinese Application No. 201180066970.6.
Office Action issued Apr. 3, 2015 in Chinese Application No. 201180051048.X.
Office Action issued May 15, 2015 in U.S. Appl. No. 14/274,448.
Office Action for U.S. Appl. No. 12/982,269 mailed May 22, 2015.
Office Action issued Feb. 25, 2016 in Chinese Application No. 201180051048.X.
Office Action issued Feb. 1, 2016 in Taiwanese Application 102124069.
Office Action issued Feb. 6, 2016 in Chinese Application No. 201180054442.9.
Office Action issued Feb. 4, 2016 in U.S. Appl. No. 14/274,448.
Office Action issued Mar. 7, 2016 in U.S. Appl. No. 14/450,812.
Office Action issued Dec. 28, 2015 in Taiwanese Application No. 102149110.
Office Action issued Dec. 25, 2015 in Chinese Application No. 201410264248.9.
Office Action issued Dec. 30, 2015 in Taiwanese Application No. 104123757.
International Search Report and Written Opinion mailed Nov. 27, 2015 in International Application PCT/US2015/038999.
Office Action issued Jan. 15, 2016 in Chinese Application No. 201180066970.6.
International Preliminary Report on Patentability issued Feb. 9, 2016 in International Application PCT/US2014/050544.
International Search Report and Written Opinion mailed Feb. 9, 2016 in International Application PCT/US2015/55710.
Office Action issued Oct. 22, 2015 in Taiwanese Application No. 103139449.
Office Action issued Oct. 16, 2015 in Taiwanese Application No. 103145582.
Office Action issued on Nov. 25, 2015 in Japanese Application No. 2015-005091.
Office Action issued Nov. 17, 2015 in Taiwanese Application 103102171.
Office Action issued Nov. 20, 2015 in Taiwanese Application 104108370.

(56) References Cited

OTHER PUBLICATIONS

Office Action issued on Nov. 27, 2015 in Taiwanese Application No. 100138526.
International Search Report and Written Opinion mailed Jan. 8, 2016 in International Application No. PCT/US2015/055728.
Office Action issued Jan. 4, 2016 in U.S. Appl. No. 14/311,954.
Office Action issued Nov. 9, 2015 in U.S. Appl. No. 14/503,598.
Office Action issued Jan. 15, 2016 in U.S. Appl. No. 14/632,739.
Office Action issued Jan. 4, 2016 in U.S. Appl. No. 14/293,164.
Office Action issued Jan. 7, 2016 in U.S. Appl. No. 14/322,503.
Office Action issued Jan. 14, 2016 in U.S. Appl. No. 14/459,398.
Office Action issued Apr. 21, 2016 in U.S. Appl. No. 14/322,503.
Office Action issued Apr. 14, 2016 in U.S. Appl. No. 14/704,143.
Office Action issued Apr. 27, 2016 in U.S. Appl. No. 14/291,888.
Office Action mailed Mar. 29, 2016 in Japanese Application No. 2014-138265.
International Preliminary Report on Patentability issued on Mar. 22, 2016 in International Application PCT/US2014/056558.
Decision issued on Jan. 30, 2016 in Taiwanese Application 099142971.
Office Action issued Apr. 6, 2016 in Taiwanese Application 100149997.
Decision issued Mar. 28, 2016 in Taiwanese Application 103143553.
Office Action issued Apr. 27, 2016 in Chinese Application 201410265340.7.
Office Action issued Apr. 29, 2016 in Chinese Application 201301284409.6.
Office Action issued Jul. 6, 2016 in U.S. Appl. No. 14/334,848.
Notice of Allowance issued Jun. 22, 2016 in U.S. Appl. No. 14/293,164.
Office Action issued Jun. 3, 2016 in U.S. Appl. No. 14/459,398.
Office Action issued Jun. 1, 2016 in U.S. Appl. No. 13/693,207.
Notice of Allowance issued Jul. 25, 2016 in U.S. Appl. No. 12/945,492.
Office Action issued May 16, 2016 in U.S. Appl. No. 12/633,313.
Office Action issued Jun. 29, 2016 in Chinese Application 201280030352.0.
Office Action issued Jun. 16, 2016 in Taiwanese Application 100138526.
Office Action issued Jun. 17, 2016 in Chinese Application 201410264248.9.
Notice of Allowance mailed Aug. 30, 2016 in U.S. Appl. No. 14/291,888.
Office Action issued Aug. 22, 2016 in U.S. Appl. No. 14/450,812.
International Search Report and Written Opinion mailed Aug. 18, 2016 in International Application No. PCT/US2016/032774.
Office Action issued Nov. 3, 2016 in U.S. Appl. No. 14/501,983.
Office Action issued Sep. 28, 2016 in U.S. Appl. No. 14/516,402.
Office Action issued Sep. 27, 2016 in U.S. Appl. No. 14/704,143.
Office Action issued Sep. 22, 2016 in U.S. Appl. No. 14/032,166.
Notice of Allowance mailed Oct. 20, 2016 in U.S. Appl. No. 14/632,739.
Office Action issued Oct. 11, 2016 in U.S. Appl. No. 14/516,162.

* cited by examiner

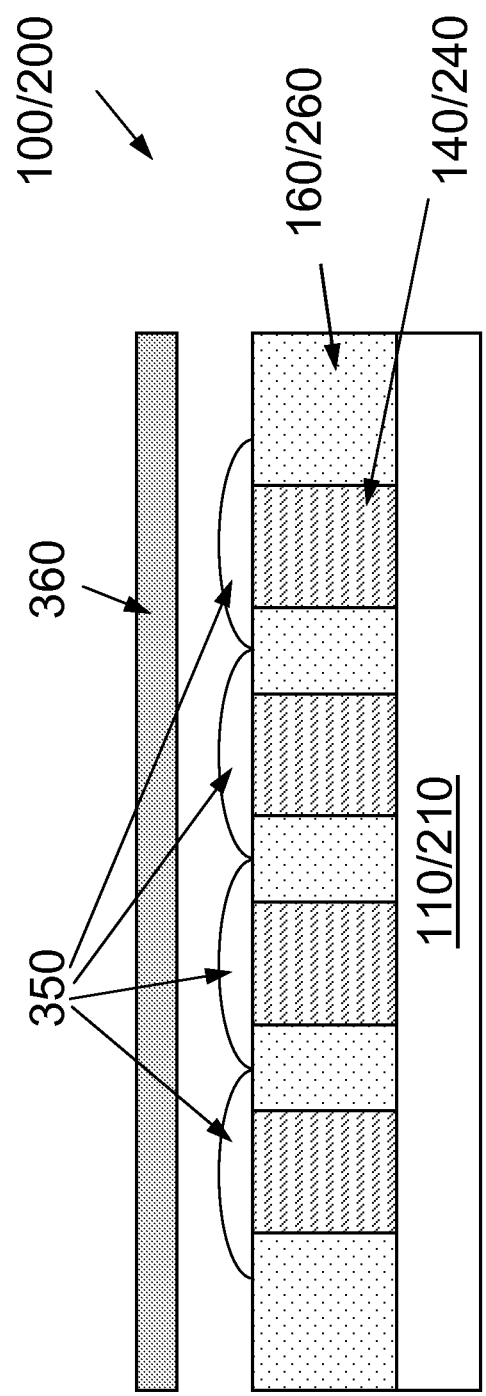

FULL COLOR SINGLE PIXEL INCLUDING DOUBLET OR QUADRUPLET SI NANOWIRES FOR IMAGE SENSORS

CROSS-REFERENCE TO RELATED APPLICATIONS

This application is a continuation of U.S. application Ser. No. 12/967,880, filed Dec. 14, 2010. This application is related to U.S. patent application Ser. Nos. 12/204,686 (granted as U.S. Pat. No. 7,646,943), Ser. No. 12/648,942 (granted as U.S. Pat. No. 8,229,255), Ser. No. 12/270,233 (granted as U.S. Pat. No. 8,274,039), Ser. No. 12/472,264 (granted as U.S. Pat. No. 8,269,985), Ser. Nos. 12/472,271, 12/478,598, 12/573,582, 12/575,221, 12/633,323, 12/633,318, 12/633,313, 12/633,305, 12/621,497, 12/633,297, 61/266,064, 61/357,429, 61/306,421, 12/945,492, 12/910,664, 12/966,514, 12/966,535 and 12/966,573, the disclosures of which are hereby incorporated by reference in their entirety.

BACKGROUND

An image sensor may be fabricated to have a large number of sensor elements (pixels), generally more than 1 million, in a (Cartesian) square grid. The pixels may be photodiodes, or other photosensitive elements, that are operable to convert electromagnetic radiation (light) into electrical signals.

Recent advances in semiconductor technologies have enabled the fabrication of nanostructures such as nanotubes, nanocavities and nanowires. Optical properties of nanostructures have been one of the recent research focuses. Among the available nanostructures, nanowires have drawn a lot of interest because of their usefulness as an optoelectronic sensor element. An image sensor that harness unique optical properties of nanowires is therefore desirable.

SUMMARY

Described herein is an image sensor comprising a substrate and one or more of pixels thereon, wherein each of the pixels comprises a first subpixel and a second subpixel; the first subpixel comprises a first nanowire operable to generate an electrical signal upon exposure to light of a first wavelength; the second subpixel comprises a second nanowire operable to generate an electrical signal upon exposure to light of a second wavelength different from the first wavelength; the first and second nanowires extend essentially perpendicularly from the substrate. The term "image sensor" as used herein means a device that converts an optical image to an electric signal. An image sensor can be used in digital cameras and other imaging devices. Examples of image sensors include a charge-coupled device (CCD) or a complementary metal-oxide-semiconductor (CMOS) active pixel sensor. The term "pixel" as used herein means the smallest addressable light-sensing element of an image sensor. Each pixel is individually addressable. Pixels in an image sensor can be arranged in a two-dimensional grid. Each pixel samples characteristics such as intensity and color of a small area of an image projected onto the image sensor. The color sampled by a pixel can be represented by three or four component intensities such as red, green, and blue, or cyan, magenta, yellow, and black. Many image sensors are, for various reasons, not capable of sensing different colors at the same location. Therefore, each pixel is divided into regions known as "subpixels", each of the regions being capable of sensing a single color. The color sampled by a pixel can be calculated from the single colors sensed by the subpixels in the pixel. The term nanowires "extending essentially perpendicularly from the substrate" as used herein means that angles between the nanowires and the substrate are from 85° to 90°. The term "nanowire" as used herein means a structure that has a size constrained to at most 1000 nm in two dimensions and unconstrained in the other dimension.

According to an embodiment, each pixel of the image sensor can further comprise one or more photodiodes located between the substrate and the nanowires. The term "photodiode" as used herein means a type of photodetector capable of converting light into either current or voltage. A photodiode can have a p-n junction or p-i-n junction. When a photon of sufficient energy strikes the photodiode, it excites an electron, thereby creating a free electron and a hole. The electron and hole can be collected to at electrodes of the photodiode as a current or voltage.

According to an embodiment, the substrate comprises silicon, silicon oxide, silicon nitride, sapphire, diamond, silicon carbide, gallium nitride, germanium, indium gallium arsenide, lead sulfide and/or a combination thereof.

According to an embodiment, at least one pixel of the image sensor comprises a clad; the first subpixel and the second subpixel of the at least one pixel are embedded in the clad. The term "clad" as used herein means a layer of substance surrounding the subpixels. The term "embed" as used herein means to surround or cover something closely.

According to an embodiment, the image sensor further comprises a material in space between the pixels.

According to an embodiment, the clad comprises silicon nitride, silicon oxide, and/or a combination thereof.

According to an embodiment, the clad is substantially transparent to visible light.

According to an embodiment, the first and second nanowires have refractive indexes equal to or greater than a refractive index of the clad.

According to an embodiment, the material has a refractive index smaller than a refractive index of the clad.

According to an embodiment, the first nanowire and the second nanowire have different absorption spectra. The term "absorptance" as used herein means a fraction of light absorbed at a specified wavelength. The term "absorption spectrum" as used herein means absorptance as a function of wavelength.

According to an embodiment, the first nanowire and the second nanowire have a distance of at least 100 nm.

According to an embodiment, each of the first and second nanowires has a p-n or p-i-n junction therein. The term "p-i-n junction" as used herein means a structure of a lightly doped or intrinsic semiconductor region sandwiched between a p-type semiconductor region and an n-type semiconductor region. The p-type and n-type regions can be heavily doped for Ohmic contacts. The term "p-n junction" as used herein means a structure with a p-type semiconductor region and an n-type semiconductor region in contact with each other.

According to an embodiment, the electrical signal comprise an electrical voltage, an electrical current, an electrical conductance or resistance, and/or a change thereof.

According to an embodiment, the first nanowire and/or the second nanowire has a surface passivation layer. The terms "passivation" and "passivate" as used herein means a process of eliminating dangling bonds (i.e., unsatisfied valence on immobilized atoms).

According to an embodiment, the image sensor is operable to absorb substantially all (e.g. >50%, >70%, or >90%)

visible light (light with wavelengths of about 390 to 750 nm.) impinged thereon. Absorbing >50%, 70% or 90% of all visible light as used herein means that the image sensor has absorptance greater than 50%, greater than 70%, or greater than 90% across the entire visible spectrum (about 390 to 750 nm wavelength), respectively.

According to an embodiment, the image sensor further comprises electronic circuitry operable to detect electrical signals generated by the first and second nanowires.

According to an embodiment, the first and second nanowires comprise silicon.

According to an embodiment, the first nanowire has a radius of about 25 nm (e.g. from 23 to 27 nm) and the second nanowire has a radius of about 40 nm (e.g. from 38 to 42 nm).

According to an embodiment, the clad has a cylindrical shape with a diameter of about 300 nm (e.g. 280 to 320 nm).

According to an embodiment, the pixels have different orientations. The term "different orientations" as used herein is illustrated in FIGS. 1B and 2B and means a pixel is rotated and offset laterally relative to a neighbor pixel thereof.

According to an embodiment, the photodiodes have absorption spectra different from absorption spectra of the first and second nanowires. Two absorption spectra being "different" as used herein means the absorption spectra have different absorptance at one or more one wavelength.

According to an embodiment, each of the pixels further comprises a third subpixel and the third subpixel comprises a third nanowire operable to generate an electrical signal upon exposure to light of a third wavelength different from the first and second wavelengths, wherein the third nanowire extends essentially perpendicularly from the substrate.

According to an embodiment, the third nanowire comprises silicon.

According to an embodiment, the third nanowire has a radius of about 45 nm (e.g. from 42 to 48 nm).

According to an embodiment, the image sensor further comprises couplers above each of the pixels, each of the couplers having a convex surface and being effective to focus substantially all visible light impinged thereon into the clad.

According to an embodiment, each of the couplers has substantially the same footprint as the pixel underneath. The term "footprint" as used herein means an area perpendicularly projected by a structure such as a pixel or a coupler on the substrate.

According to an embodiment, the image sensor further comprises an infrared filter operable to prevent infrared light from reaching the pixels. The term "infrared light" as used herein means electromagnetic radiation with a wavelength between 0.7 and 300 micrometres. The term" infrared filter" as used herein means a device operable to reflect or block infrared light while allowing visible light to pass through.

According to an embodiment, the image sensor does not comprise an infrared filter.

According to an embodiment, the first nanowire and/or the second nanowire has a transistor therein or thereon. A "transistor" as used herein means a semiconductor device used to amplify and switch electronic signals. It is made of a solid piece of semiconductor material, with at least three terminals for connection to an external circuit. A voltage or current applied to one pair of the transistor's terminals changes the current flowing through another pair of terminals.

According to an embodiment, the image sensor further comprises electronic circuitry operable to detect electrical signals from the photodiodes.

According to an embodiment, a method of manufacturing an image sensor, comprising dry etching or VLS growth, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate. The VLS growth is a method for the growth of one-dimensional structures, such as nanowires, from chemical vapor deposition. Growth of a crystal through direct adsorption of a gas phase on to a solid surface is generally very slow. The VLS growth circumvents this by introducing a catalytic liquid alloy phase which can rapidly adsorb a vapor to supersaturation levels, and from which crystal growth can subsequently occur from nucleated seeds at the liquid-solid interface. The physical characteristics of nanowires grown in this manner depend, in a controllable way, upon the size and physical properties of the liquid alloy.

According to an embodiment, a method of sensing an image comprises: projecting the image onto an image sensor, wherein the image sensor comprises a substrate and one or more of pixels thereon, wherein each of the pixels comprises at a first subpixel and a second subpixel, the first subpixel comprises a first nanowire operable to generate an electrical signal upon exposure to light of a first wavelength, the second subpixel comprises a second nanowire operable to generate an electrical signal upon exposure to light of a second wavelength different from the first wavelength, wherein the first and second nanowires extend essentially perpendicularly from the substrate; detecting the electrical signals from the first nanowire and the second nanowire; calculating a color of each pixel from the electrical signals.

BRIEF DESCRIPTION OF THE DRAWINGS

Embodiments of the present disclosure will now be disclosed, by way of example only, with reference to the accompanying schematic drawings in which corresponding reference symbols indicate corresponding parts, in which:

FIG. 3 shows a schematic of couplers and an infrared filter.

DETAILED DESCRIPTION

Figure 1A:
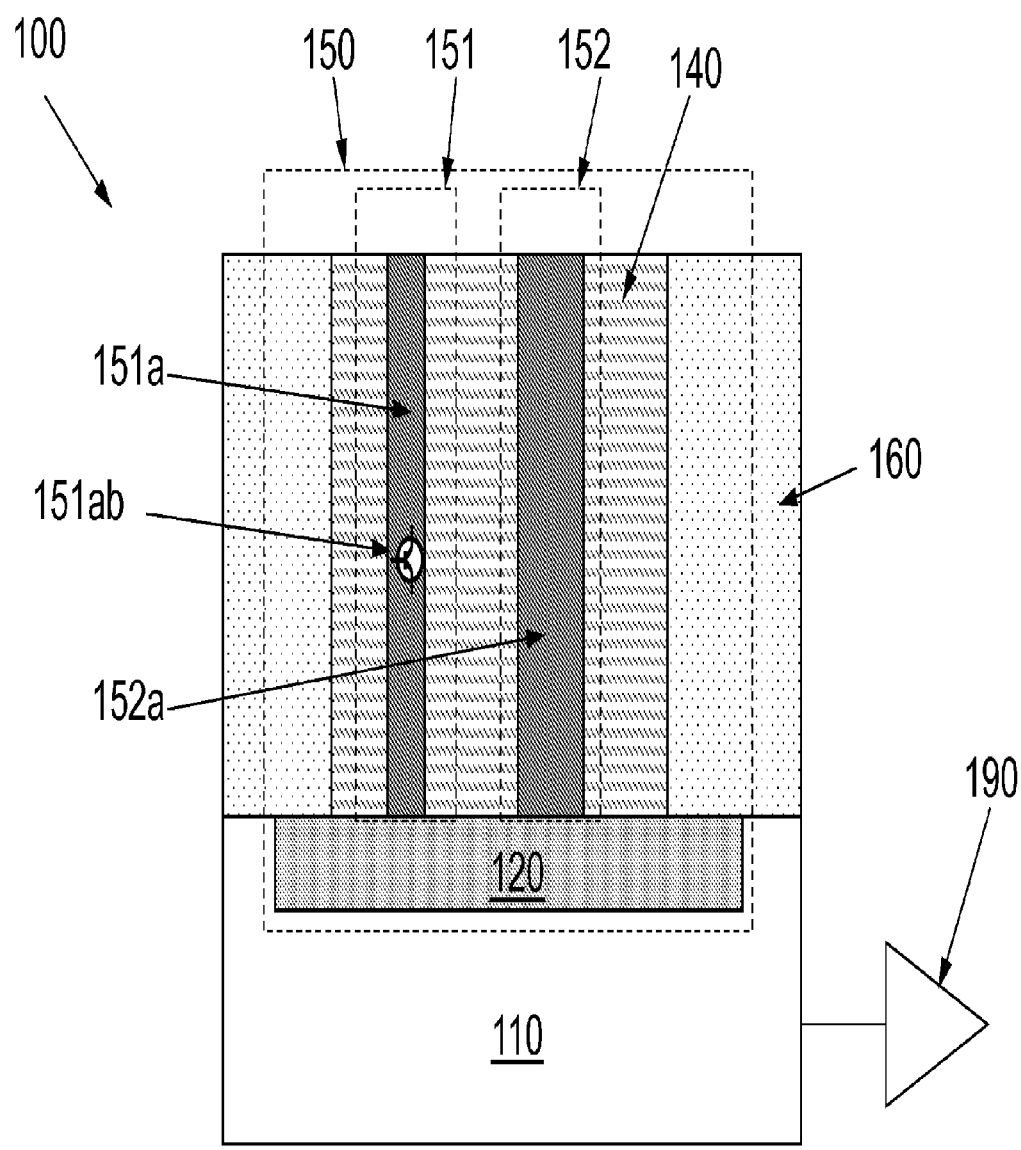
FIG. 1A shows a schematic cross-sectional view of an image sensor according to an embodiment.

In the following detailed description, reference is made to the accompanying drawings, which form a part thereof. In the drawings, similar symbols typically identify similar components, unless the context dictates otherwise. The illustrative embodiments described in the detail description, drawings, and claims are not meant to be limiting. Other embodiments may be utilized, and other changes may be made, without departing from the spirit or scope of the subject matter presented here.

The human eye has photoreceptors (called cone cells) for medium- and high-brightness color vision, with sensitivity peaks in short (S, 420-440 nm), middle (M, 530-540 nm), and long (L, 560-580 nm) wavelengths (there is also the low-brightness monochromatic "night-vision" receptor, called rod cell, with peak sensitivity at 490-495 nm). Thus, in principle, three parameters describe a color sensation. The tristimulus values of a color are the amounts of three primary colors in a three-component additive color model needed to match that test color. The tristimulus values are most often given in the CIE 1931 color space, in which they are denoted X, Y, and Z.

In the CIE XYZ color space, the tristimulus values are not the S, M, and L responses of the human eye, but rather a set of tristimulus values called X, Y, and Z, which are roughly red, green and blue, respectively (note that the X, Y, Z values are not physically observed red, green, blue colors. Rather, they may be thought of as 'derived' parameters from the red, green, blue colors). Two light sources, made up of different mixtures of various wavelengths, may appear to be the same color; this effect is called metamerism. Two light sources have the same apparent color to an observer when they have the same tristimulus values, no matter what spectral distributions of light were used to produce them.

Due to the nature of the distribution of cones in the eye, the tristimulus values depend on the observer's field of view. To eliminate this variable, the CIE defined the standard (colorimetric) observer. Originally this was taken to be the chromatic response of the average human viewing through a 2° angle, due to the belief that the color-sensitive cones resided within a 2° arc of the fovea. Thus the CIE 1931 Standard Observer is also known as the CIE 1931 2° Standard Observer. A more modern but less-used alternative is the CIE 1964 10° Standard Observer, which is derived from the work of Stiles and Burch, and Speranskaya.

The color matching functions are the numerical description of the chromatic response of the observer as described above.

The CIE has defined a set of three color-matching functions, called, $\bar{x}(\lambda)$, $\bar{y}(\lambda)$, and $\bar{z}(\lambda)$, which can be thought of as the spectral sensitivity curves of three linear light detectors that yield the CIE XYZ tristimulus values X, Y, and Z. These functions are known collectively as the CIE standard observer.

The tristimulus values for a color with a spectral power distribution $I(\lambda)$ are given in terms of the standard observer by:

$$X = \int_0^\infty I(\lambda)\bar{x}(\lambda)\,d\lambda,$$

$$Y = \int_0^\infty I(\lambda)\bar{y}(\lambda)\,d\lambda,$$

$$Z = \int_0^\infty I(\lambda)\bar{z}(\lambda)\,d\lambda,$$

wherein $\lambda$ is the wavelength of the equivalent monochromatic light (measured in nanometers).

EXAMPLES

FIG. 1A shows a schematic partial cross-sectional view of an image sensor 100, according to an embodiment. The image sensor 100 comprises a substrate 110, one or more pixels 150. At least one pixel 150 comprises a clad 140 and a plurality of subpixels embedded in the clad 140. Two subpixels 151 and 152 are shown in FIG. 1A as an example. Each of the subpixels comprises a nanowire (e.g. a nanowire 151a in the subpixel 151 and a nanowire 152a in the subpixel 152) extending essentially perpendicularly from the substrate 110. Space between the pixels 150 is preferably filled with a material 160. Each pixel 150 can further comprise one or more photodiodes 120 located between the substrate 110 and the nanowires 151a and 152a.

The substrate 110 can comprise any suitable material such as silicon, silicon oxide, silicon nitride, sapphire, diamond, silicon carbide, gallium nitride, germanium, indium gallium arsenide, lead sulfide, and/or a combination thereof.

The photodiode 120 can be any suitable photodiode. The photodiode 120 can have a p-n junction of a p-i-n junction and any suitable circuitry. The photodiode 120 preferably has a footprint that completely encloses a footprint of the clad 140.

The clad 140 can comprise any suitable material, such as silicon nitride, silicon oxide, and/or a combination thereof. The clad 140 is preferably substantially transparent to visible light, preferably with a transmittance of at least 50%, more preferably at least 70%, most preferably at least 90%. In one example, the clad 140 is silicon nitride and has a cylindrical shape with a diameter of about 300 nm.

The material 160 can comprise any suitable material such as silicon dioxide. A refractive index of the material 160 is preferably smaller than a refractive index of the clad 140.

The nanowires (e.g. 151a and 152a) in the subpixels (e.g. 151 and 152) have refractive indexes equal to or greater than the refractive index of the clad 140. The nanowires and the photodiode 120 have different absorption spectra. For example, the nanowire 151a has strong absorptance in blue wavelengths, as shown by an exemplary absorption spectrum 181 in FIG. 1C; the nanowire 152a has a strong absorptance in green wavelengths, as shown by an exemplary absorption spectrum 182 in FIG. 1C; the photodiode 120 has strong absorptance in red wavelengths, as shown by an exemplary absorption spectrum 180 in FIG. 1C. The nanowires can have different diameters and/or different materials. Each nanowire in one pixel 150 preferably has a distance of at least 100 nm, preferable at least 200 nm, to a nearest neighboring nanowire in the same pixel. The nanowires can be positioned at any suitable positions in the clad 140.

The nanowires (e.g. 151a and 152a) in the subpixels (e.g. 151 and 152) are operable to generate electrical signals upon receiving light. One exemplary nanowire is a photodiode with a p-n or p-i-n junction therein, details of which can be found in U.S. patent application Publication Ser. Nos. 12/575,221 and 12/633,305, each of which is hereby incorporated by reference in its entirety. The electrical signals can comprise an electrical voltage, an electrical current, an electrical conductance or resistance, and/or a change thereof. The nanowires can have a surface passivation layer.

Substantially all visible light (e.g. >50%, >70%, or >90%) impinged on the image sensor 100 is absorbed by the subpixels (e.g. 151 and 152) and the photodiode 120. The subpixels and the photodiode absorb light with different wavelengths.

The image sensor 100 can further comprise electronic circuitry 190 operable to detect electrical signals from the subpixels and the photodiode 120.

In one specific example, each pixel 150 has two subpixels 151 and 152. Each subpixel 151 and 152 has only one nanowire 151a and 152a, respectively. The nanowire 151a comprises silicon, has a radius of about 25 nm, and has a strong absorptance in blue wavelengths. The nanowire 152a comprises silicon, has a radius of about 40 nm and has a strong absorptance in cyan wavelengths. The nanowires 151a and 152a are about 200 nm apart but embedded in the same clad 140. Each of the pixels 150 can have more than two subpixels according to an embodiment. The nanowires can comprise other suitable materials such as mercury cadmium telluride. The nanowires can have other suitable radii from 10 nm to 250 nm.

Figure 1B:
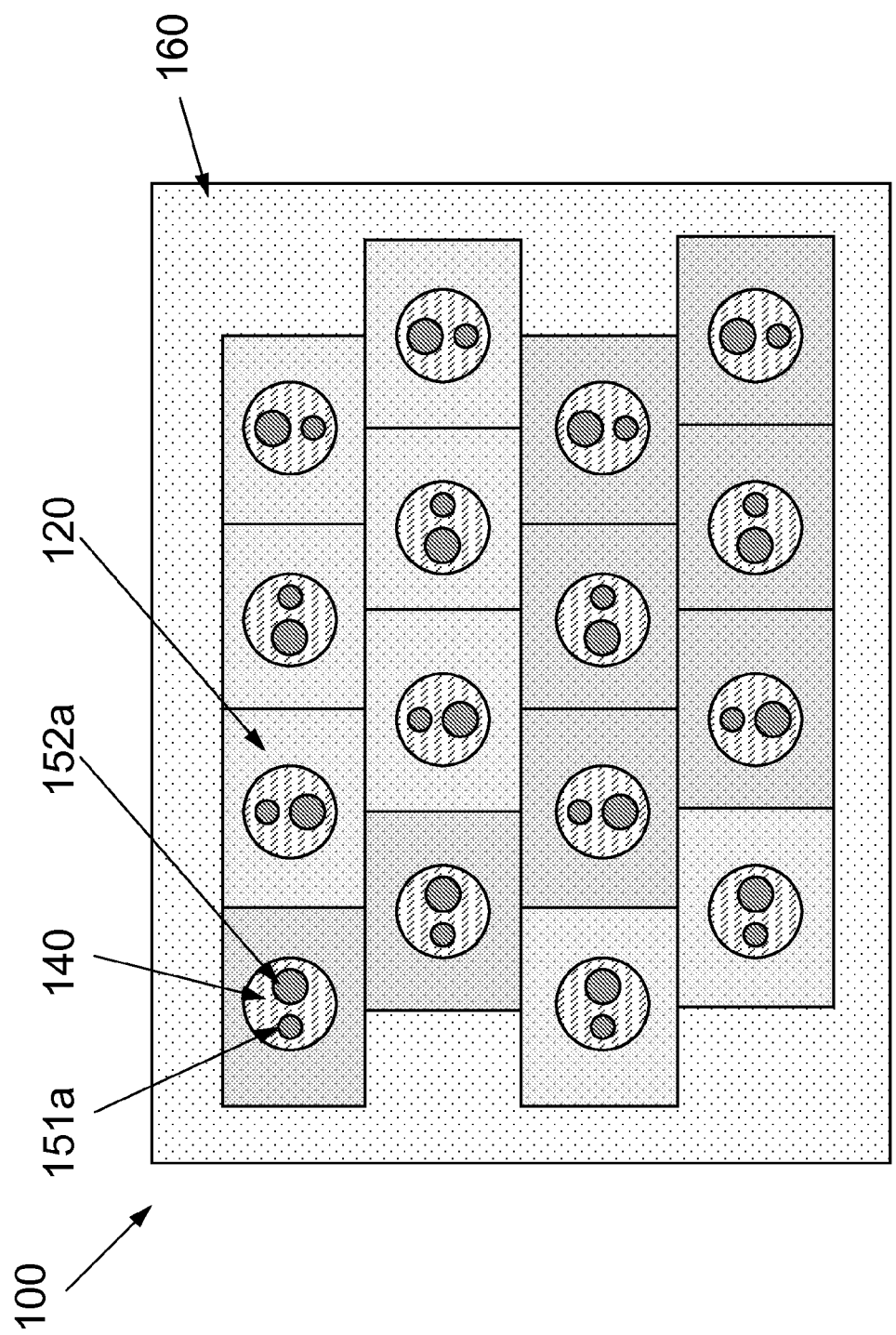
FIG. 1B shows a schematic top view of the image sensor of FIG. 1A.
Figure 1C:
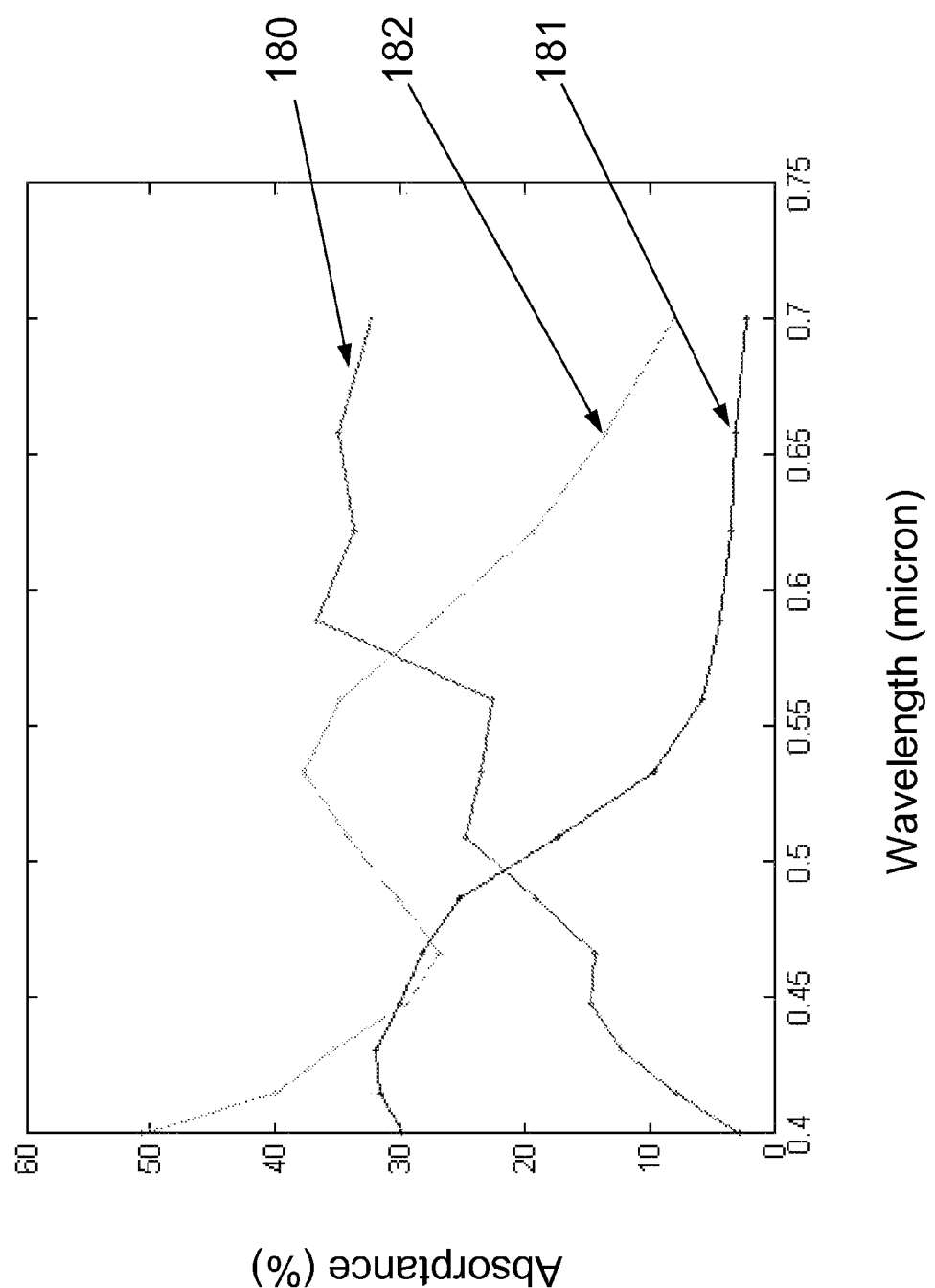
FIG. 1C shows exemplary absorption spectra of two nanowires in two subpixels in a pixel of the image sensor of FIG. 1A and a photodiode on the substrate of the image sensor of FIG. 1A.

FIG. 1B shows a schematic partial top view of the image sensor 100. As shown in exemplary FIG. 1B, the pixels 150 can have different orientations, which reduces or eliminates effects of directions of incident light.

In one embodiment, the subpixels 151 and 152 and the photodiode 120 in each pixel 150 of the image sensor 100 has color matching functions substantially the same as the color matching functions of the CIE 1931 2° Standard Observer or the CIE 1964 10° Standard Observer.

Figure 2A:
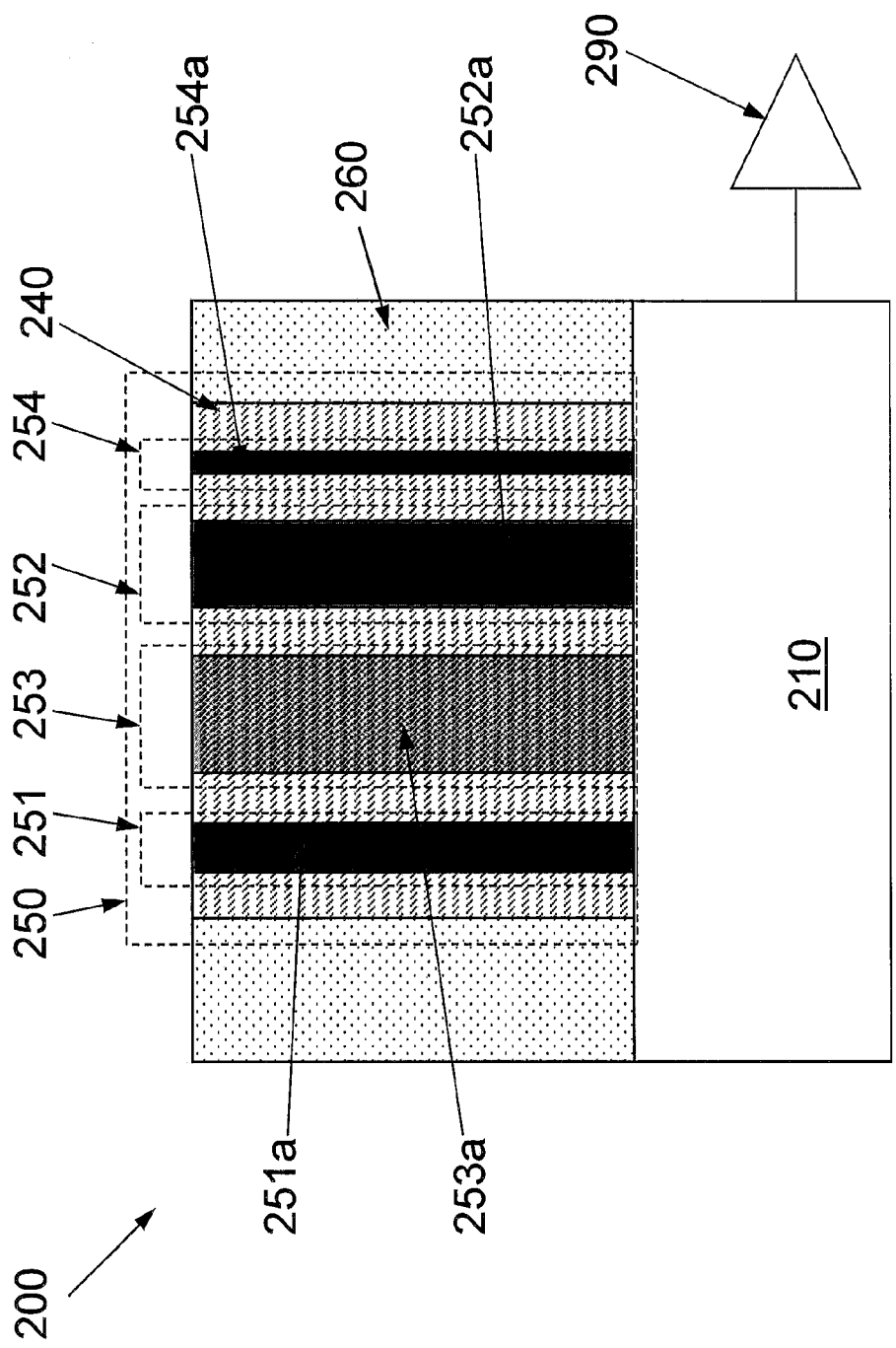
FIG. 2A shows a schematic cross-sectional view of an image sensor according to an embodiment.

FIG. 2A shows a schematic partial cross-sectional view of an image sensor 200, according to an embodiment. The image sensor 200 comprises a substrate 210, one or more pixels 250. The substrate 210 preferably does not comprise any photodiode therein. At least one pixel 250 comprises a clad 240 and a plurality of subpixels embedded in the clad 240. Three subpixels 251, 252 and 253 are shown in FIG. 2A as an example. Each of the subpixels comprises a nanowire (e.g. a nanowire 251a in the subpixel 251, a nanowire 252a in the subpixel 252 and a nanowire 253a in the subpixel 253) extending essentially perpendicularly from the substrate 210. Space between the pixels 250 is preferably filled with a material 260.

The substrate 210 can comprise any suitable material such as silicon, silicon oxide, silicon nitride, sapphire, diamond, silicon carbide, gallium nitride, germanium, indium gallium arsenide, lead sulfide and/or a combination thereof.

The clad 240 can comprise any suitable material, such as silicon nitride, silicon oxide, etc. The clad 240 is preferably substantially transparent to visible light, preferably with a transmittance of at least 50%, more preferably at least 70%, most preferably at least 90%. In one example, the clad 240 is silicon nitride and has a cylindrical shape with a diameter of about 300 nm.

The material 260 can comprise any suitable material such as silicon dioxide. A refractive index of the material 260 is preferably smaller than a refractive index of the clad 240.

The nanowires (e.g. 251a, 252a and 253a) in the subpixels (e.g. 251, 252 and 253) have refractive indexes equal to or greater than the refractive index of the clad 240. The nanowires and the substrate 210 have different absorption spectra. For example, the nanowire 251a has strong absorptance in blue wavelengths, as shown by an exemplary absorption spectrum 281 in FIG. 2C; the nanowire 252a has a strong absorptance in green wavelengths, as shown by an exemplary absorption spectrum 282 in FIG. 2C; the nanowire 253a has a strong absorptance across the entire visible spectrum, as shown by an exemplary absorption spectrum 283 in FIG. 2C; the substrate 210 has a strong absorptance in red wavelengths, as shown by an exemplary absorption spectrum 280 in FIG. 2C. The nanowires can have different diameters and/or different materials. Each nanowire in one pixel 250 preferably has a distance of at least 100 nm, preferable at least 200 nm, to a nearest neighboring nanowire in the same pixel. The nanowires in the clad 240 can be positioned at any suitable positions in the clad 240. The nanowires can have a surface passivation layer. The nanowires can comprise other suitable materials such as mercury cadmium telluride. The nanowires can have other suitable radii from 10 nm to 250 nm.

The nanowires (e.g. 251a, 252a and 253a) in the subpixels (e.g. 251, 252 and 253) are operable to generate electrical signals upon receiving light. One exemplary nanowire is a photodiode with a p-n or p-i-n junction therein, details of which can be found in U.S. patent application Publication Ser. Nos. 12/575,221 and 12/633,305, each of which is hereby incorporated by reference in its entirety. The electrical signals can comprise an electrical voltage, an electrical current, an electrical conductance or resistance, and/or a change thereof.

Substantially all visible light impinged on the image sensor 200 is absorbed by the subpixels (e.g. 251, 252 and 253). The subpixels absorb light with different wavelengths.

The image sensor 200 can further comprise electronic circuitry 290 operable to detect electrical signals from the subpixels.

In one specific example, each pixel 250 has three subpixels 251, 252 and 253. Each subpixel 251, 252 and 253 has only one nanowire 251a, 252a and 253a, respectively. The nanowire 251a comprises silicon, has a radius of about 25 nm, and has a strong absorptance in blue wavelengths. The nanowire 252a comprises silicon, has a radius of about 40 nm and has a strong absorptance in green wavelengths. The nanowire 253a comprises silicon, has a radius of about 45 nm and has a strong absorptance across the entire visible spectrum. The nanowires 251a, 252a and 253a are about 200 nm apart but embedded in the same clad 240. The clad 140 is cylindrical in shape with a diameter of about 400 nm. Each of the pixels 250 can have more than three subpixels according to an embodiment.

In another specific example, each pixel 250 has four subpixels 251, 252, 253 and 254. Each subpixel 251, 252, 253 and 254 has only one nanowire 251a, 252a, 253a and 254a respectively. The nanowire 251a comprises silicon, has a radius of about 25 nm, and has a strong absorptance in blue wavelengths. The nanowire 252a comprises silicon, has a radius of about 40 nm and has a strong absorptance in green wavelengths. The nanowire 253a comprises silicon, has a radius of about 45 nm and has a strong absorptance across the entire visible spectrum. The nanowire 254a comprises silicon, has a radius of about 35 nm and has a strong absorptance in blue green wavelength (e.g. 400 to 550 nm). The nanowires 251a, 252a, 253a and 254a are about 200 nm apart but embedded in the same clad 240. The clad 140 is cylindrical in shape with a diameter of about 400 nm. FIG. 2D shows exemplary absorption spectra 291, 292, 293 and 294 of the nanowires 251a, 252a, 253a and 254a, respectively.

Figure 2B:
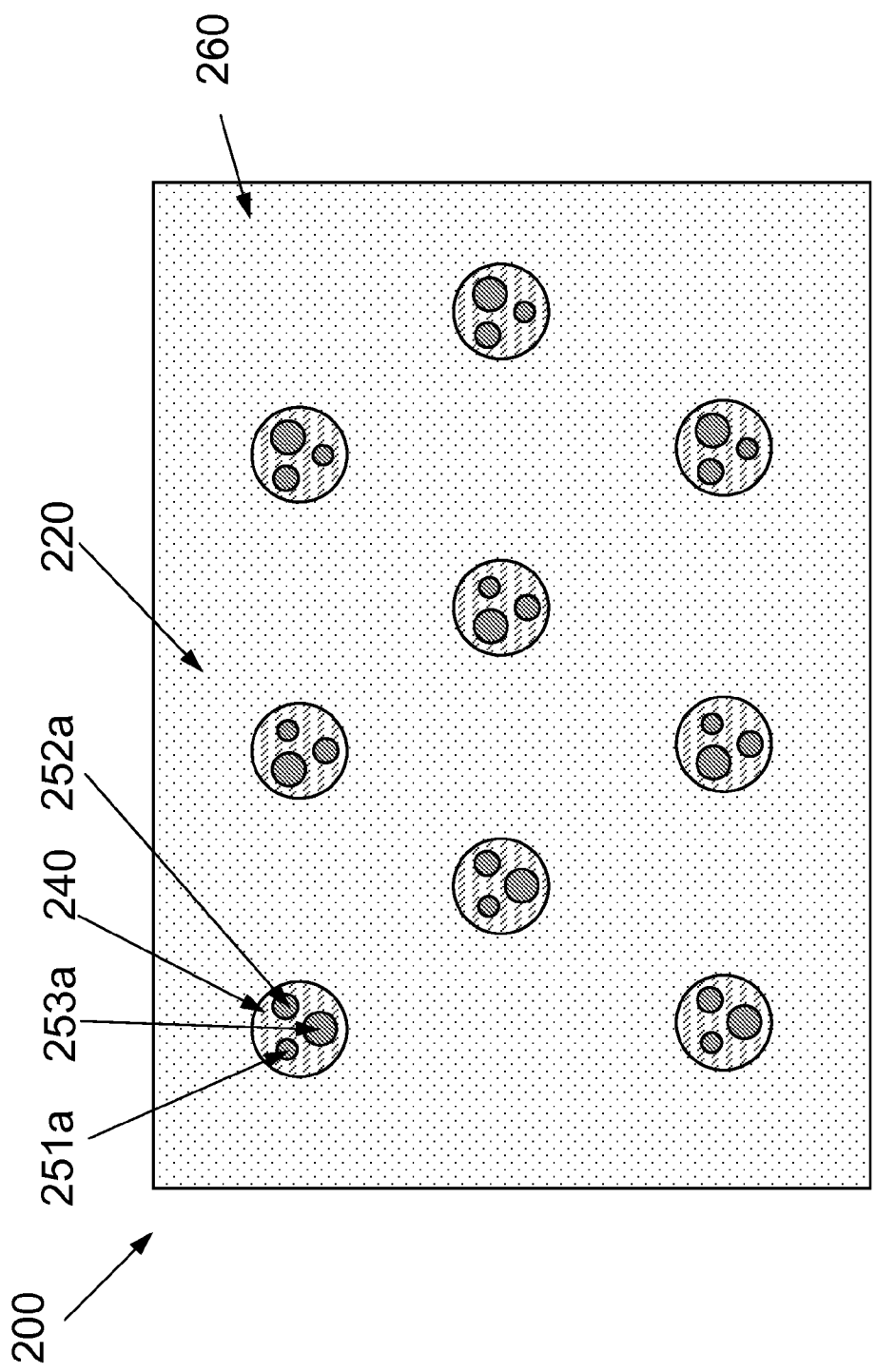
FIG. 2B shows a schematic top view of the image sensor of FIG. 2A.
Figure 2C:
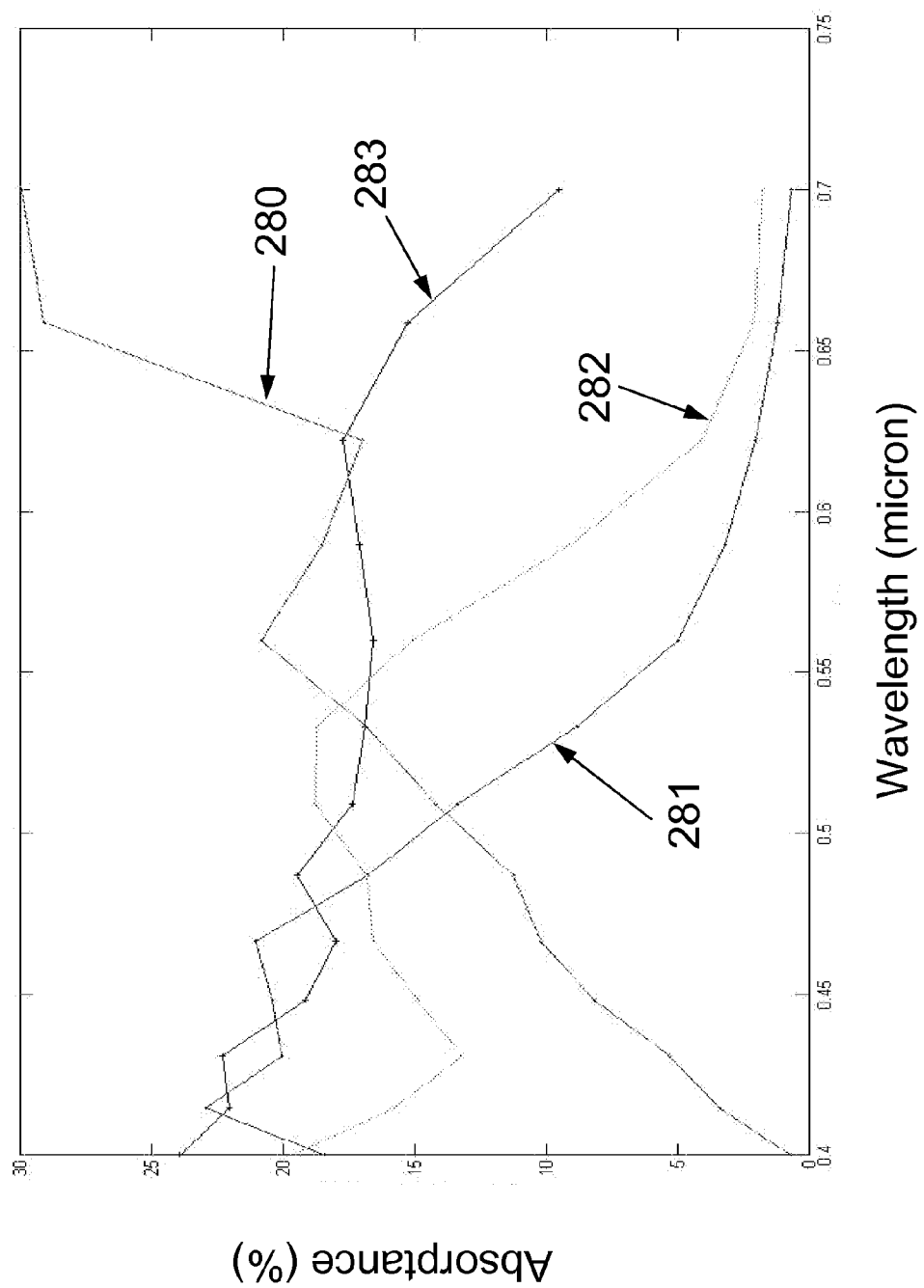
FIG. 2C shows exemplary absorption spectra of three nanowires in three subpixels in a pixel of the image sensor of FIG. 2A and the substrate of the image sensor of FIG. 2A.
Figure 2D:
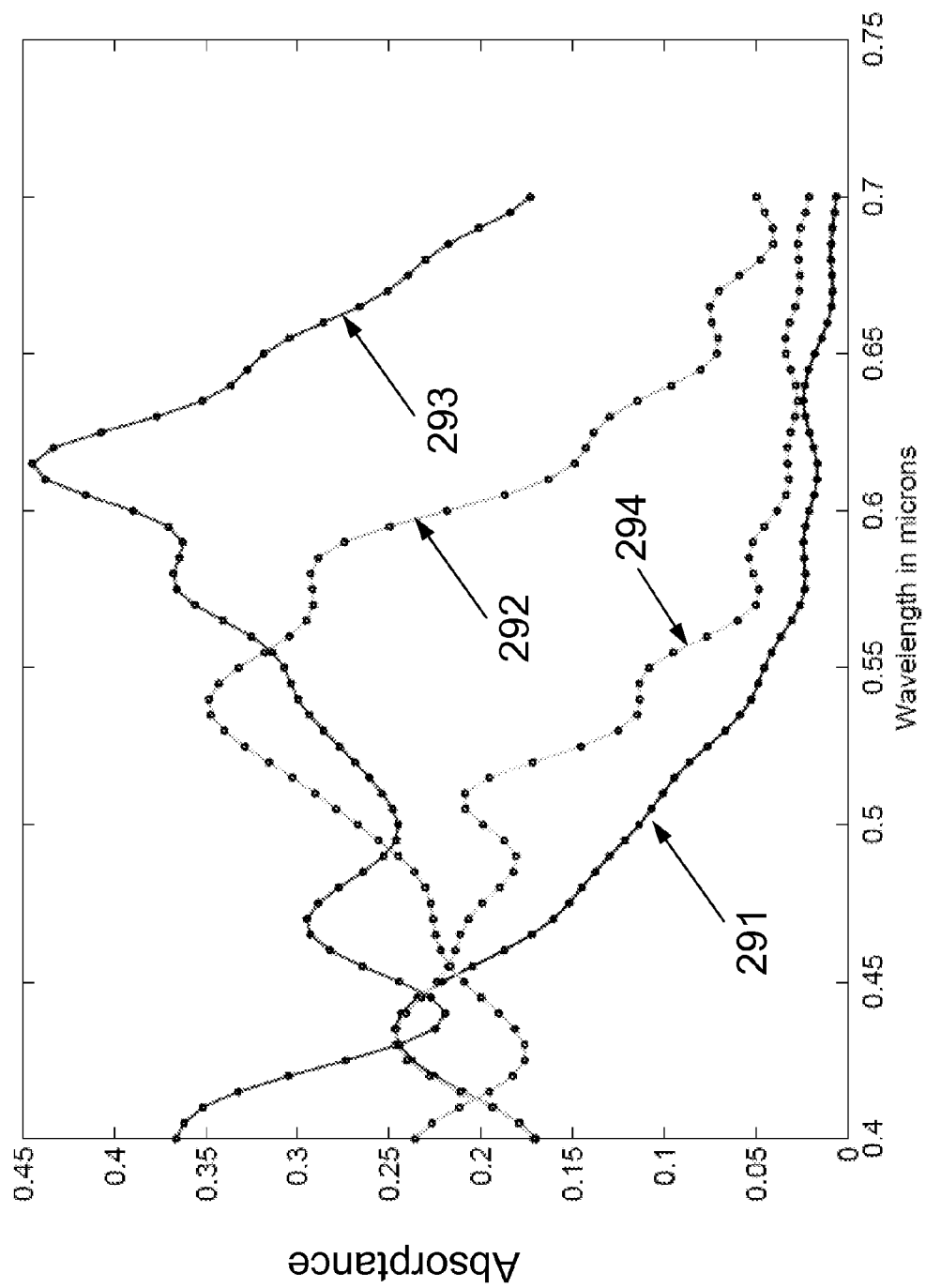
FIG. 2D shows exemplary absorption spectra of four nanowires in four subpixels in a pixel of the image sensor of FIG. 2A and the substrate of the image sensor of FIG. 2A.

FIG. 2B shows a schematic partial top view of the image sensor 200. As shown in exemplary FIG. 2B, the pixels 250 can have different orientations, which reduces or eliminates effects of directions of incident light.

According to an embodiment, the image sensor 100 or 200 can further comprise couplers 350 above each pixel 150 or 250, as shown in FIG. 3. Each of the couplers 350 preferably has substantially the same footprint as the pixel underneath and has a convex surface. The coupler 350 is effective to focus substantially all visible light impinged thereon into the clad 140 or 240.

According to an embodiment, as shown in FIG. 3, the image sensor 100 or 200 can further comprise an infrared filter 360, which is operable to prevent infrared light, such as light with wavelengths above 650 nm, from reaching the pixels. According to an embodiment, the image sensor 100 or 200 does not comprise an infrared filter.

According an embodiment, the nanowires can be made by a dry etching process or a Vapor Liquid Solid (VLS) growth method. Of course, it will be appreciated that other materials and/or fabrication techniques may also be used for fabricating the nanowires in keeping with the scope of the invention. For instance, nanowires fabricated from an indium arsenide (InAs) wafer or related materials could be used for IR applications.

The nanowires can also be made to have a strong absorption in wavelengths not in the visible spectrum, such as in the ultraviolet (UV) or infrared (IR) spectra. In an embodiment, each nanowire can have transistor (e.g., transistor 151ab in FIG. 1A) therein or thereon.

In one embodiment, the subpixels 251, 252 and 253 in each pixel 250 of the image sensor 200 has color matching functions substantially the same as the color matching functions of the CIE 1931 2° Standard Observer or the CIE 1964 10° Standard Observer.

Figure 4:
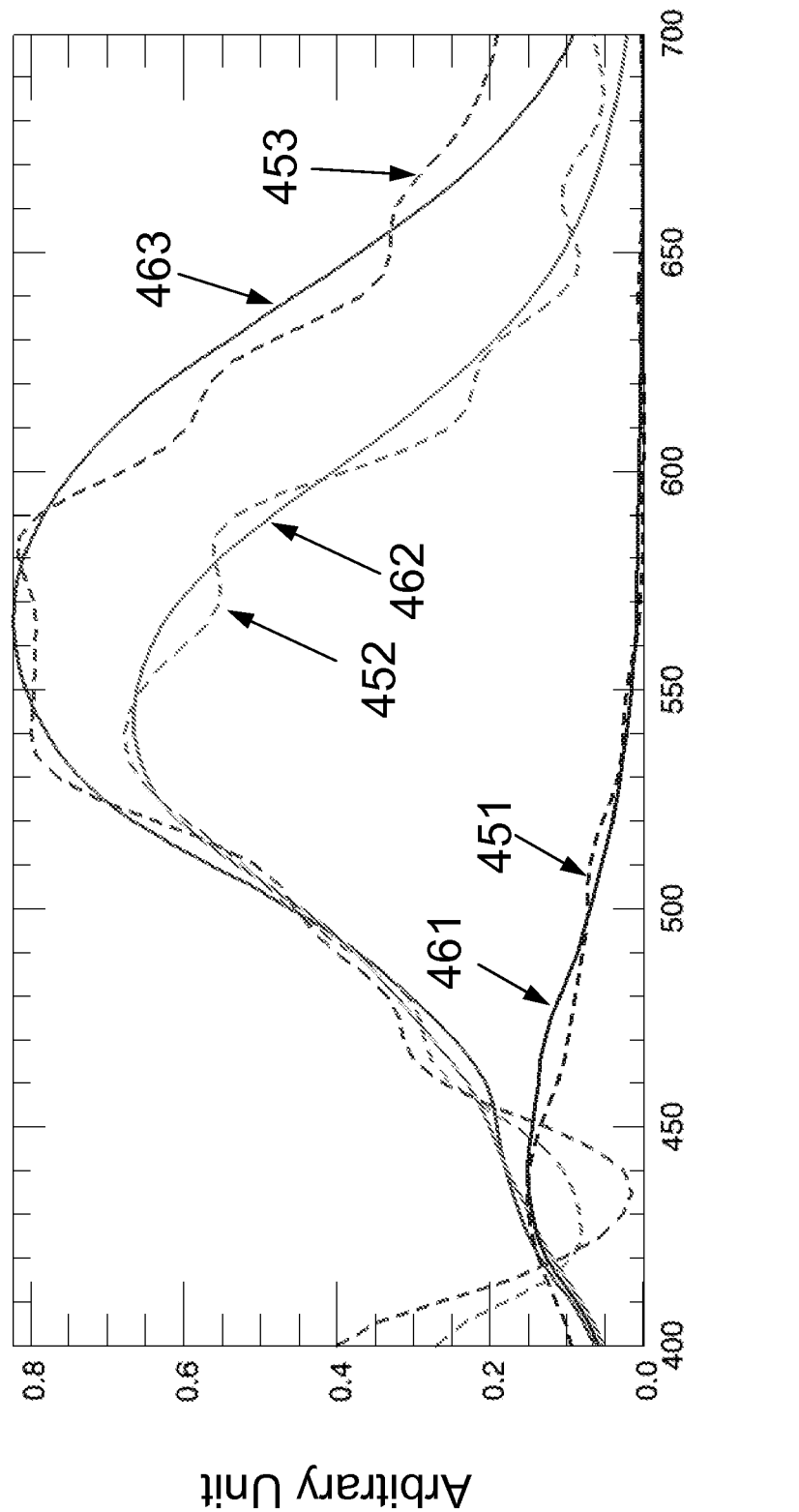
FIG. 4 shows exemplary color-matching functions of three subpixels in the image sensor, and color-matching functions the CIE standard observer.

FIG. 4 shows exemplary color-matching functions 451, 452 and 453 of the subpixels 251, 252 and 253, respectively. The color-matching functions 461, 462 and 463 are the $\bar{x}(\lambda)$, $\bar{y}(\lambda)$, and $\bar{z}(\lambda)$ of the CIE standard observer.

The image sensor 100 or 200 can be used to sense and capture images. A method of sensing an image comprises projecting the image onto the image sensor 100 or 200 using any suitable optics such as lenses and/or mirrors; detecting an electrical signal from the nanowire in each subpixel in each pixel using suitable circuitry; calculating a color of each pixel from the electrical signals of the subpixels therein.

The foregoing detailed description has set forth various embodiments of the devices and/or processes by the use of diagrams, flowcharts, and/or examples. Insofar as such diagrams, flowcharts, and/or examples contain one or more functions and/or operations, it will be understood by those within the art that each function and/or operation within such diagrams, flowcharts, or examples can be implemented, individually and/or collectively, by a wide range of hardware, software, firmware, or virtually any combination thereof.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation.

The subject matter described herein sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

All references, including but not limited to patents, patent applications, and non-patent literature are hereby incorporated by reference herein in their entirety.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed:

1. An image sensor comprising a substrate and one or more of pixels thereon, wherein each of the pixels comprises a first subpixel and a second subpixel; the first subpixel comprises a first nanowire; the second subpixel comprises a second nanowire; the first and second nanowires extend essentially perpendicularly from the substrate, wherein each pixel of the image sensor further comprises one or more photodiodes, wherein the first nanowire and/or the second nanowire has a transistor therein or thereon.

2. The image sensor of claim 1, wherein the substrate comprises silicon, silicon oxide, silicon nitride, sapphire, diamond, silicon carbide, gallium nitride, germanium, indium gallium arsenide, lead sulfide and/or a combination thereof.

3. The image sensor of claim 1, wherein at least one pixel comprises a clad; the first subpixel and the second subpixel of the at least one pixel are embedded in the clad.

4. The image sensor of claim 3, wherein the clad is substantially transparent to visible light.

5. The image sensor of claim 3, further comprising couplers above each of the pixels, each of the couplers having a convex surface and being effective to focus substantially all visible light impinged thereon into the clad.

6. The image sensor of claim 1, wherein the first nanowire and the second nanowire have different absorption spectra.

7. The image sensor of claim 1, wherein each of the first and second nanowires has a p-n or p-i-n junction therein.

8. The image sensor of claim 1, being operable to absorb at least 50% of all visible light impinged thereon.

9. The image sensor of claim 1, further comprising electronic circuitry operable to detect electrical signals generated by the first and second nanowires.

10. The image sensor of claim 1, wherein the pixels have different orientations.

11. A method of manufacturing an image sensor, comprising dry etching or VLS growth, wherein the image sensor comprises a substrate and one or more of pixels thereon, wherein each of the pixels comprises at a first subpixel and a second subpixel, the first subpixel comprises a first nanowire, the second subpixel comprises a second nanowire, wherein the first and second nanowires extend essentially perpendicularly from the substrate, wherein each pixel of the image sensor further comprises one or more photodiodes, wherein the first nanowire and/or the second nanowire has a transistor therein or thereon.

12. The method of claim 11, wherein each of the pixels further comprises a third subpixel and the third subpixel comprises a third nanowire operable to generate an electrical signal upon exposure to light.

13. The method of claim 12, wherein each of the pixels further comprises a fourth subpixel and the fourth subpixel comprises a fourth nanowire operable to generate an electrical signal upon exposure to light of a fourth wavelength different from the first, second and third wavelengths, wherein the fourth nanowire extends essentially perpendicularly from the substrate.

14. The method of claim 11, wherein the photodiodes have absorption spectra different from absorption spectra of the first and second nanowires.

15. The method of claim 11, the image sensor further comprises an infrared filter operable to prevent infrared light from reaching the pixels.

16. A method of sensing an image comprises:
projecting the image onto an image sensor, wherein the image sensor comprises a substrate and one or more of pixels thereon, wherein each of the pixels comprises at a first subpixel and a second subpixel, the first subpixel comprises a first nanowire, the second subpixel comprises a second nanowire, wherein the first and second nanowires extend essentially perpendicularly from the substrate, wherein each pixel of the image sensor further comprises one or more photodiodes; detecting the electrical signals from the first nanowire and the second nanowire; and calculating a color of each pixel from the electrical signals, wherein the first nanowire and/or the second nanowire has a transistor therein or thereon.

17. The method of claim 16, wherein the first and the second nanowires are adapted to absorb infra-red (IR) light.

18. The method of claim 16, wherein different pixels of the one or more of pixels comprise spatially separated clads.

19. The method of claim 16, wherein the one or more photodiodes are located between the substrate and the first and second nanowires.

* * * * *